(12) United States Patent
Grivna

(10) Patent No.: US 10,147,790 B2
(45) Date of Patent: Dec. 4, 2018

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/188,285

(22) Filed: Jun. 21, 2016

(65) Prior Publication Data

US 2017/0365678 A1    Dec. 21, 2017

(51) Int. Cl.
| | |
|---|---|
| *H01L 29/06* | (2006.01) |
| *H01L 29/872* | (2006.01) |
| *H01L 29/66* | (2006.01) |
| *H01L 29/78* | (2006.01) |
| *H01L 29/861* | (2006.01) |

(52) U.S. Cl.
CPC ...... *H01L 29/0696* (2013.01); *H01L 29/0619* (2013.01); *H01L 29/0684* (2013.01); *H01L 29/66136* (2013.01); *H01L 29/66143* (2013.01); *H01L 29/785* (2013.01); *H01L 29/861* (2013.01); *H01L 29/872* (2013.01); *H01L 29/0692* (2013.01)

(58) Field of Classification Search
CPC .......... H01L 29/0646; H01L 29/66143; H01L 29/0696
See application file for complete search history.

(56) References Cited

U.S. PATENT DOCUMENTS

| | | | | |
|---|---|---|---|---|
| 7,932,553 B2 * | 4/2011 | Yamaguchi | ......... | H01L 29/7813 257/328 |
| 9,735,150 B2 * | 8/2017 | Iwasaki | ............... | H01L 27/0664 |
| 2010/0072544 A1 * | 3/2010 | Pearse | .................. | H01L 29/407 257/331 |
| 2012/0012929 A1 * | 1/2012 | Saito | ................... | H01L 29/0865 257/335 |
| 2014/0264565 A1 | 9/2014 | Padmanabhan et al. | | |

\* cited by examiner

*Primary Examiner* — Matthew Reames
*Assistant Examiner* — Wilner Jean Baptiste
(74) *Attorney, Agent, or Firm* — Robert F. Hightower

(57) ABSTRACT

An embodiment of a semiconductor device includes forming an active region that extends vertically into the semiconductor material in which the semiconductor device is formed. The active region may include a P-N junction or alternately a gate or a channel region of an MOS transistor.

8 Claims, 27 Drawing Sheets

30

METHOD OF FORMING A SEMICONDUCTOR DEVICE AND STRUCTURE THEREFOR

BACKGROUND

The present invention relates, in general, to electronics, and more particularly, to semiconductors, structures thereof, and methods of forming semiconductor devices.

In the past, the semiconductor industry utilized various methods and structures to form active semiconductor devices such as diodes, transistors, etc. In some applications, the device needed to have a large current carrying capability in order to achieve a desired current capacity. For a device that had lateral current flow, the device was formed to cause lateral current flow between the active elements of the device such as the anode and cathode of a diode or the source and drain of a transistor. In order to provide the desired current capability, the active region often extended a large distance horizontally across the surface of the semiconductor material.

Some vertical current flow devices, such as for example transistors, typically were formed with a trench type of gate where the gate length was along a sidewall of the gate to form vertical current flow from the source vertically along the material adjacent the sidewalls of the gate to a drain that was on a back surface of the transistor. In order to provide the desired current capability, the trench type gate was formed with a gate width that also extended a large distance horizontally across the surface of the semiconductor material.

As current requirements increase and operating voltages decreased, the need for increased active area continually increased the amount of silicon area utilized to form the device. This resulted in higher cost and reduced functionality for a given semiconductor area.

Accordingly, it is desirable to have a method and/or a structure that provides a larger current capacity and which occupies a smaller area of the surface of the semiconductor material.

Figure 1A:
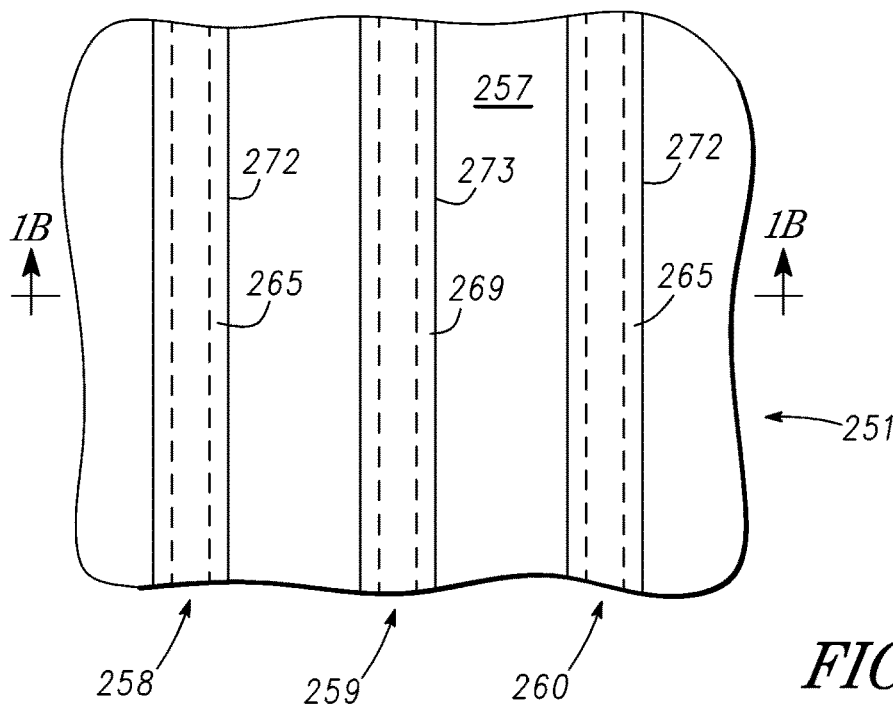
FIG. 1A illustrates an enlarged plan view of an example of an embodiment of a portion of a semiconductor device that includes one or more diodes in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

The embodiments illustrated and described hereinafter suitably may have embodiments and/or may be practiced in the absence of any element which is not specifically disclosed herein.

DETAILED DESCRIPTION OF THE DRAWINGS

Figure 1B:
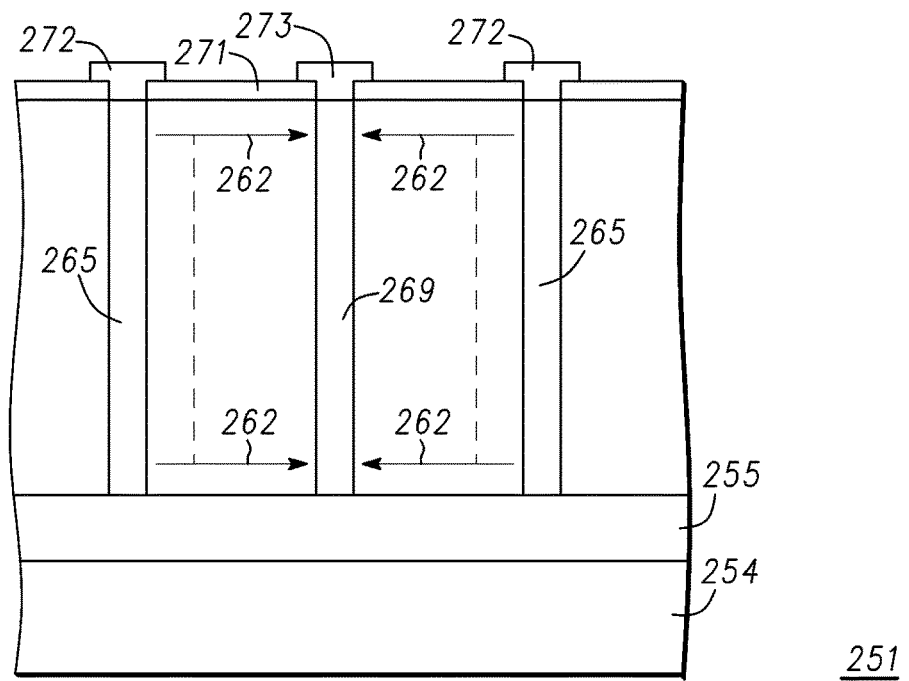
FIG. 1B illustrates a cross-sectional portion of the semiconductor device of FIG. 2A in accordance with the present invention.

FIG. 1A illustrates an enlarged plan view of an example of an embodiment of a semiconductor device 250. FIG. 1B illustrates a cross-sectional portion of device 250 along section line 1B-1B of FIG. 1A. In an embodiment, device 250 may include various types of active semiconductor devices such as transistors and/or diodes such as for example a diode 251. Diode 251 may have an embodiment that includes a first current carrying electrode formed as a cathode structure 259 and a second current carrying electrode formed as an anode structure 258 and an anode structure 260. Those skilled in the art will appreciate that diode 251 may have only one anode structure, such as for example structure 258, instead of the illustrated two anode structures 258 and 260. Additionally, those skilled in the art will appreciate that cathode structure 259 and anode structures 258 and 260 may be reversed in other embodiments.

Figure 2A:
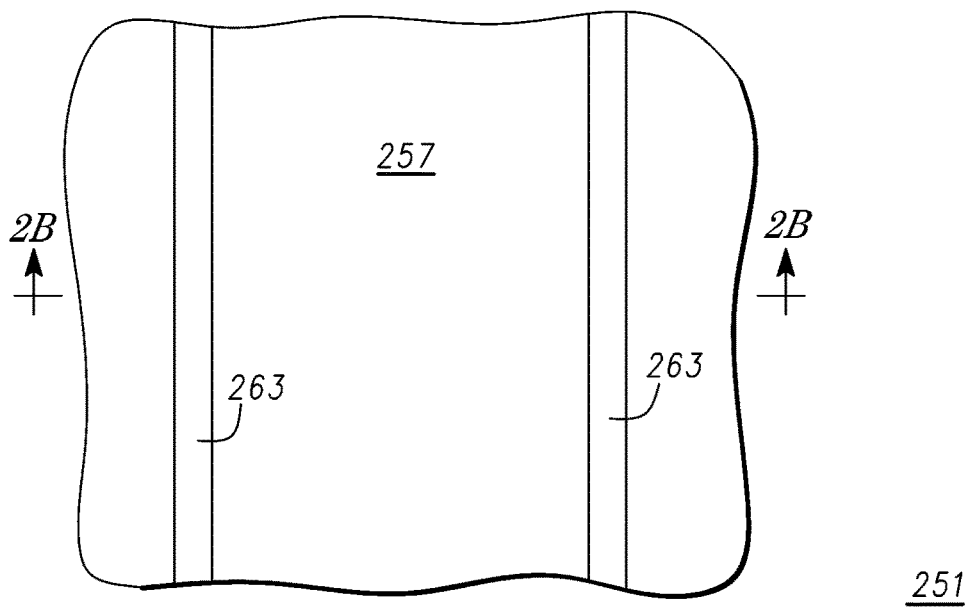
FIGS. 2A-5B illustrates various plan views and cross-sectional views of the semiconductor device of FIG. 1A/1B at various stages in an example of an embodiment of a method of forming the semiconductor device of FIG. 1A/1B in accordance with the present invention in accordance with the present invention.
Figure 2B:
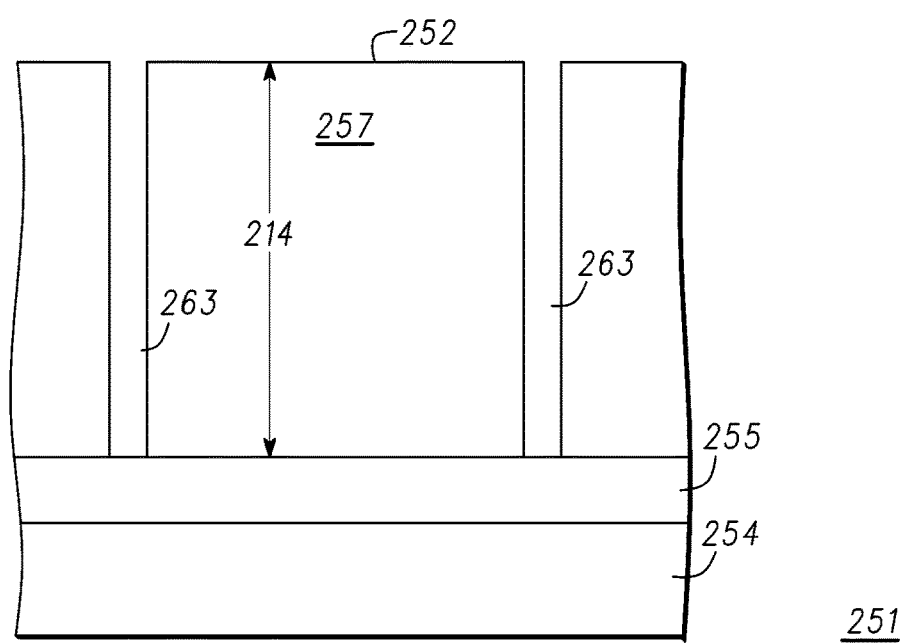

FIG. 2A illustrates an enlarged plan view of device 250 at a stage in an example of an embodiment of a method of forming device 250 and diode 251. FIG. 2B illustrates a cross-sectional portion of device 250 along section line 2B-2B of FIG. 2A. Device 250 and diode 251 may be formed on a semiconductor substrate 254. An optional insulating layer or insulator 255 may be formed on a surface of substrate 254. A first semiconductor region 257 may be formed overlying substrate 254. In an embodiment, region 257 may be formed as an epitaxial layer on a surface of substrate 254, or alternately on a surface of insulator 255. Region 257 may have an embodiment that may be formed as a doped region of substrate 254 such as for example by doping a portion of substrate 254. Substrate 254, layer 255, and region 257 may have an embodiment that is substantially the same as respective substrate 32, layer 33, and region 35.

Openings 263 may be formed in region 257 to extend from a major surface 252 of region 257 a first distance or depth 214 into region 257. Openings 263 may be formed by removing portions of region 257 where anode structures 258 and 260 are to be formed. An embodiment of openings 263 may be spaced apart by a distance sufficient to form cathode structure 259 between openings 263. In some embodiments, openings 263 may be formed completely through region 257 and in other embodiments depth 214 may be formed to be just less than the thickness of region 257. For example, distance 214 may have various embodiments wherein distance 214 may be greater than approximately twenty (20) microns, or may be less than approximately three hundred (300) microns, or may be greater than 50% of the thickness of region 257 or may be formed to be less than 95% of the thickness of region 257 or some depth in between.

Figure 3A:
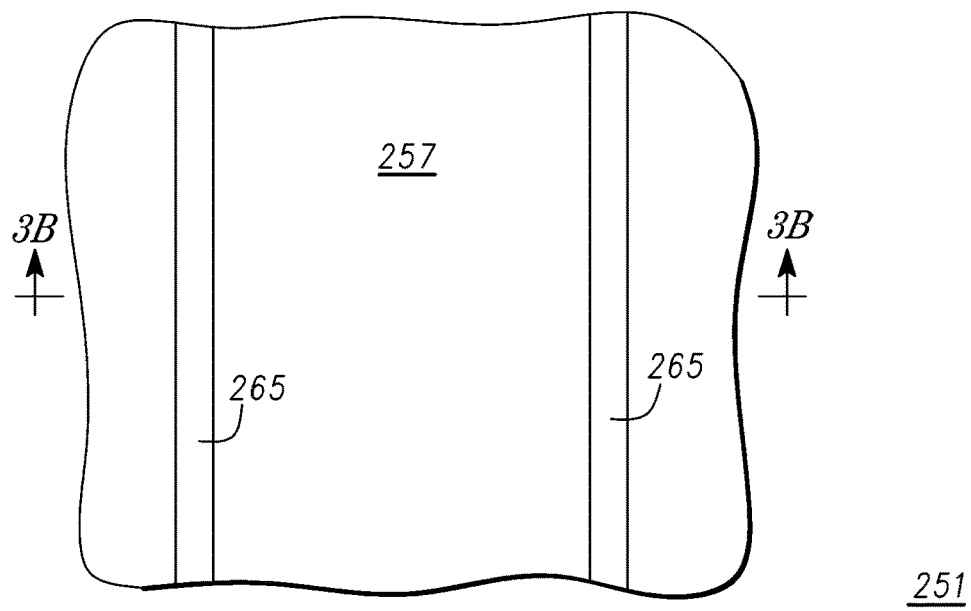
Figure 3B:
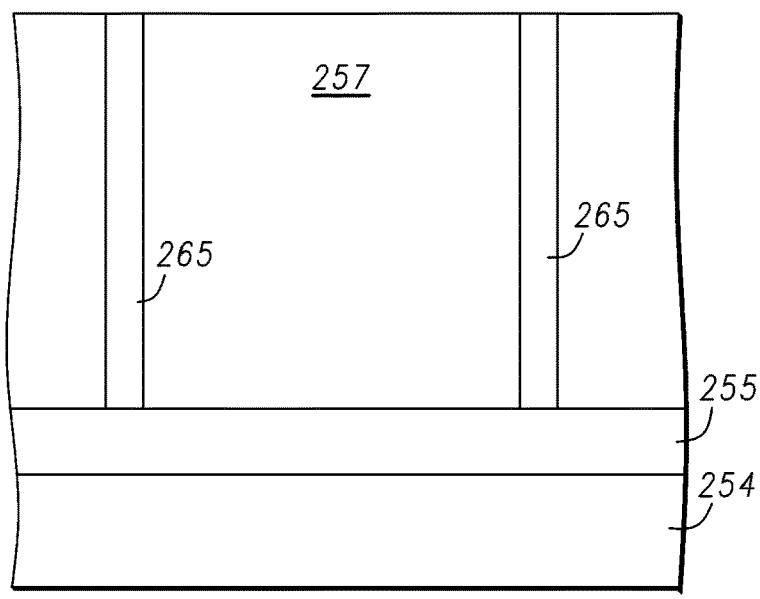

FIG. 3A illustrates a plan view of device 250 at a subsequent stage in an example of an embodiment of a method of forming device 250 and diode 251, and FIG. 3B illustrates a cross-sectional portion along section line 3B-3B of FIG. 3A. Openings 263 may be filled with a doped semiconductor material 265. In an embodiment, region 257 may be formed as N-type semiconductor material and material 265 may be formed as P-type semiconductor material. Material 265 may be formed, in an embodiment, by depositing P-type polysilicon into openings 263 or forming P-type epitaxial material in opening 263, or by forming a P-type dopant source such as for example boron doped glass into opening 263. Alternately, high angle implants may be used to dope the sidewalls of opening 263 to be P-type material.

Figure 4A:
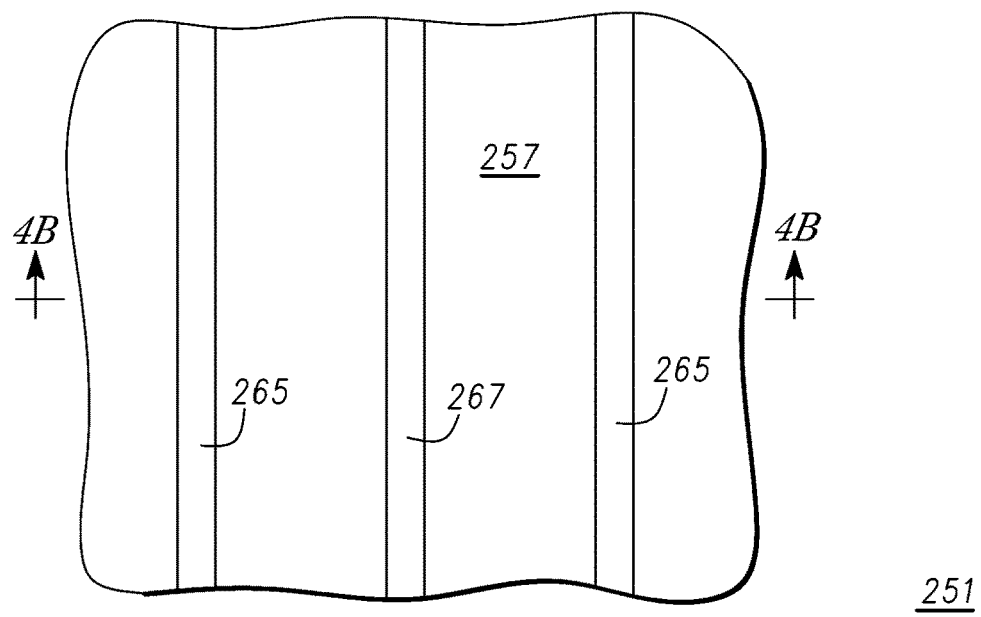
Figure 4B:
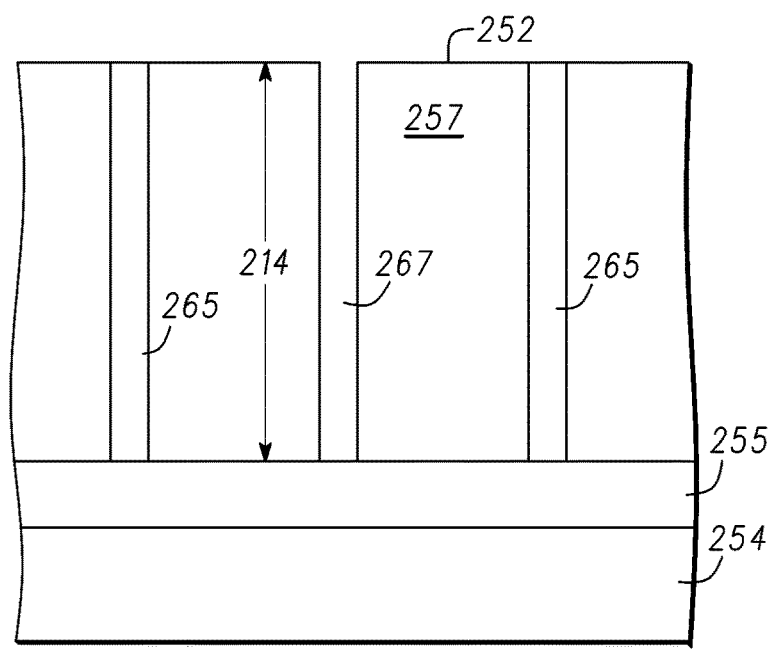

FIG. 4A illustrates a plan view of device 250 and diode 251 at a subsequent stage in an example of an embodiment of a method of forming device 250 and diode 251, and FIG. 4B illustrates a cross-sectional portion along section line 4B-4B of FIG. 4A. An opening 267 may be formed in region 257 to extend from major surface 252 into region 257 to facilitate forming cathode structure 259. Opening 267 may be formed by removing portions of region 257 where cathode structure 259 is to be formed. Opening 267 may be formed to extend distance or depth 214 into region 257 or may extend a different distance. In some embodiments, opening 267 may be formed to extend a different distance such as for example completely through region 257 or may be formed to be just less than the thickness of region 257. Opening 267 may be disposed between openings 263, either equidistant between openings 263 or some other position between openings 263. In some embodiment, opening 267 may be formed with openings 263.

Figure 5A:
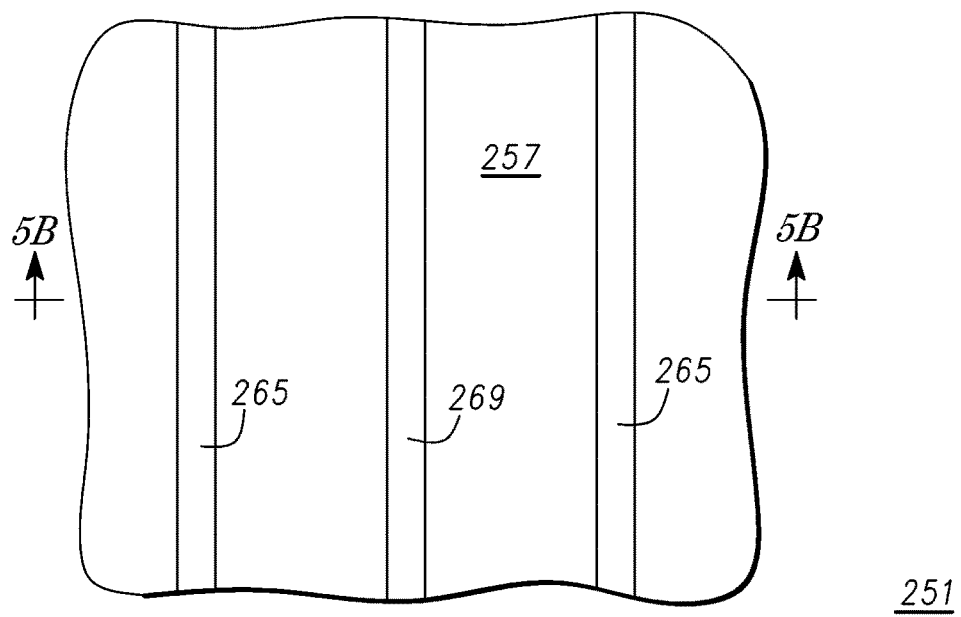
Figure 5B:
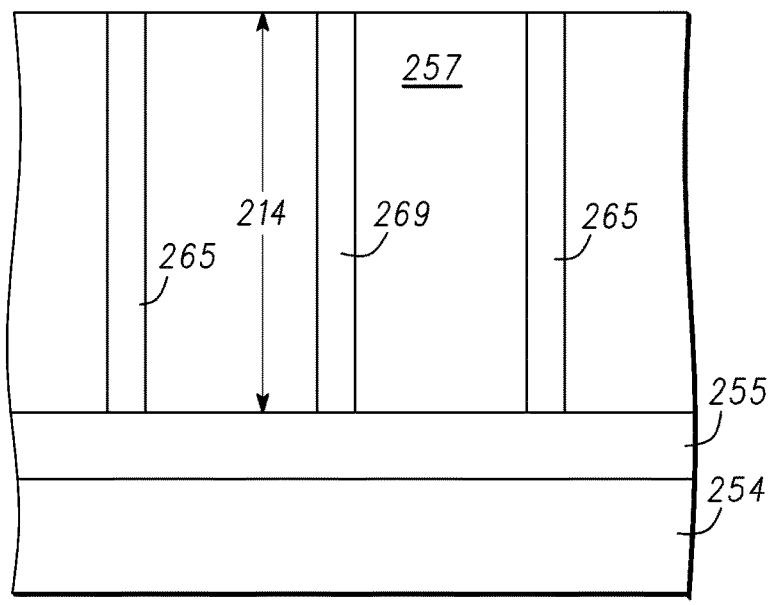

FIG. 5A illustrates a plan view of device 250 at a subsequent stage in an example of an embodiment of a method of forming device 250 and diode 251, and FIG. 5B illustrates a cross-sectional portion along section line 5B-5B of FIG. 5A. Opening 267 may be filled with a doped semiconductor material 269. In an embodiment, material 269 may be formed to have the same doping type as region 257 but at a greater doping concentration. An embodiment of material 269 may be formed by depositing N-type polysilicon into openings 267 or forming N-type epitaxial material in opening 2637, or by forming an N-type dopant source such as for example phosphorous doped glass into opening 267. Alternately, high angle implants may be used to dope the sidewalls of opening 267 to be N-type material. For example, material 269 may be N-type material with a doping concentration of approximately 1E19 atoms/cm$^3$. Region 257 may have an embodiment as N-type semiconductor material with a peak doping concentration of approximately 1E13 atoms/cm$^3$.

Referring back to FIGS. 1A and 1B, conductors 272 may be formed on material 265 to form a low resistance contact thereto. Additionally, a conductor 273 may be formed on material 269 to form a low resistance connection to material 269 and through material 269 to region 257.

Those skilled in the art will appreciated that each of materials 265 form a P-N junction with the material of region 257 thereby forming the P-N junction of diode 251. Additionally, material 269 facilitates forming a low resistance connection between conductor 273 and material 257, thus, a low resistance connection to the cathode of diode 251. Those skilled in the art will also appreciate that material 265 is the actual anode electrode of diode 251 and the material of region 257 is the actual cathode electrode of diode 251 and that material 269 facilitates forming a low resistance electrical connection to region 257.

Those skilled in the art will appreciate from the foregoing, that an embodiment of diode 251 may have a P-N junction that may extend substantially perpendicular to a major surface of diode 251 (such as for example surface 252) and form a current flow region along the depth of the P-N junction. Thus, the current flow, illustrated in a general manner by arrows 262, from anode to cathode is substantially parallel to a major surface of region 257 and the substantially parallel current flow extends along a junction depth that is substantially perpendicular to the current flow and extends into the material of region 257. Forming the junction to extend perpendicular to surface 252 facilitates forming a large P-N junction having a large surface area that can accommodate a large current flow and that does not occupy much area of surface 252 thereby reducing the cost of diode 251. Also, forming the low resistance contact, such as for example material 269, to extend perpendicular to surface 252 facilitates forming a large connection area having a large surface area that can accommodate a large current flow from the P-N junction and that does not occupy much area of surface 252. Forming the diode to have an embodiment that includes two trenches where one trench forms a P-N junction along the sidewalls of the one trench and where the other trench has a low resistance contact along sidewalls of the other trench facilitates the diode having a large current flow and occupying a small area of surface 252.

An embodiment of diode 251 may include that material 269 may be omitted and that a conductor material may be formed within opening 267 to make the low resistance contact along the sidewalls of opening 267. For example, a doped tungsten material may be formed within opening 267.

Figure 6A:
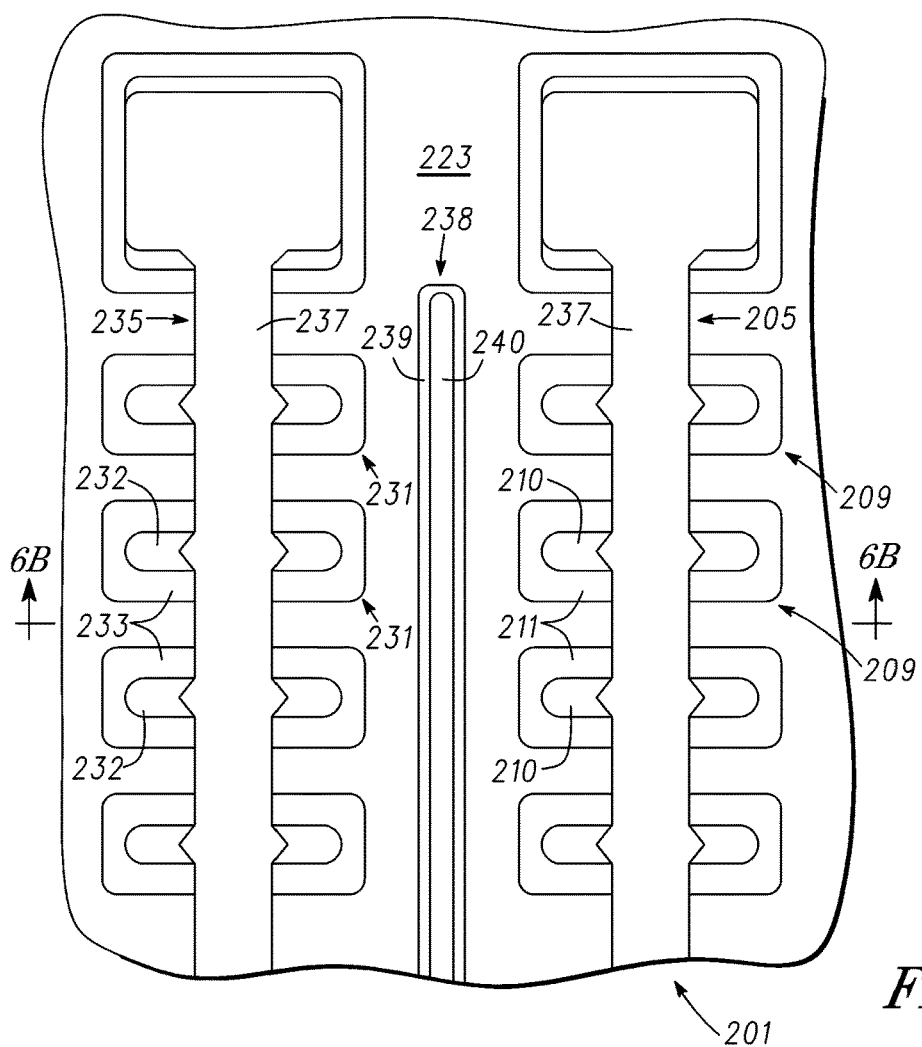
FIG. 6A illustrates an enlarged plan view of an example of an embodiment of a portion of a semiconductor device that may be an alternate embodiment of the semiconductor device of FIG. 1 in accordance with the present invention.
Figure 6B:
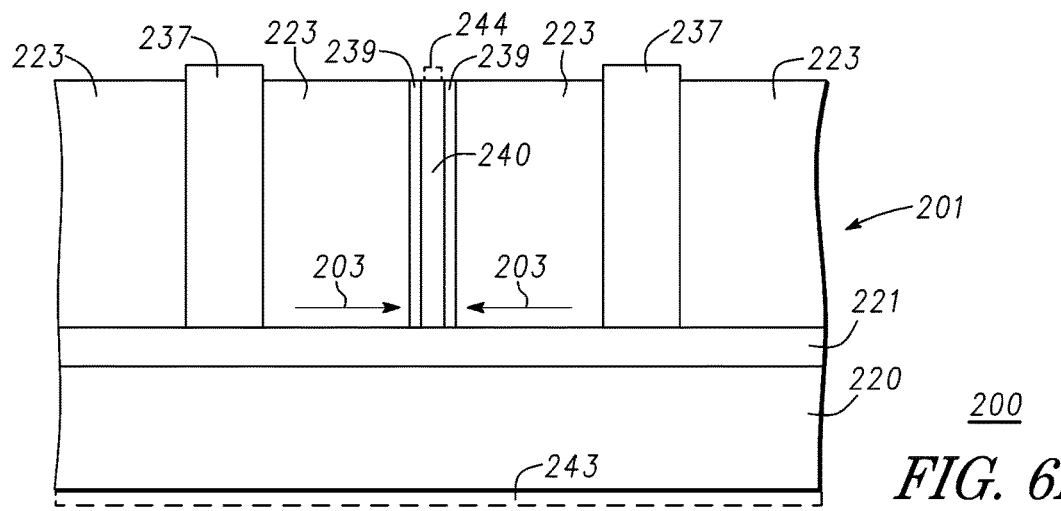
FIG. 6B illustrates a cross-sectional portion of the semiconductor device of FIG. 6A in accordance with the present invention.

FIG. 6A illustrates an enlarged plan view of an example of an embodiment of a semiconductor device 200. FIG. 6B illustrates a cross-sectional portion of device 200 along section line 6B-6B of FIG. 6A. In an embodiment, device 200 may include various types of active semiconductor devices such as transistors and diodes such as for example a Schottky barrier diode or diode 201. Diode 201 may have an embodiment that includes a first current carrying electrode formed as a cathode structure 238 and a second current carrying electrode formed as an anode structure 205 and an anode structure 235. Those skilled in the art will appreciate that diode 201 may have only one anode structure, such as for example either anode structure 205 or 235, instead of the two anode structures 205 and 235 illustrated in FIG. 6A.

Figure 7A:
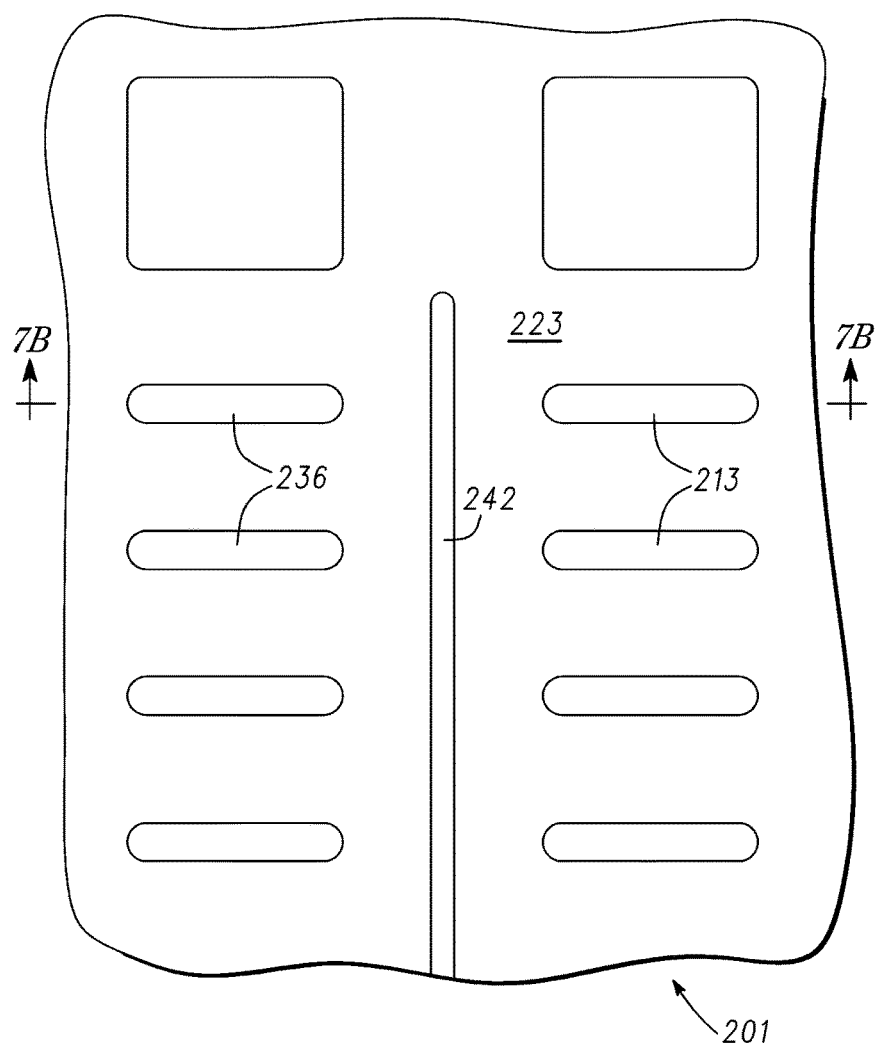
FIGS. 7A-10B illustrates various plan views and cross-sectional views of the semiconductor device of FIG. 6A/6B at various stages in an example of an embodiment of a method of forming the semiconductor device of FIG. 6A/6B in accordance with the present invention in accordance with the present invention.
Figure 7B:
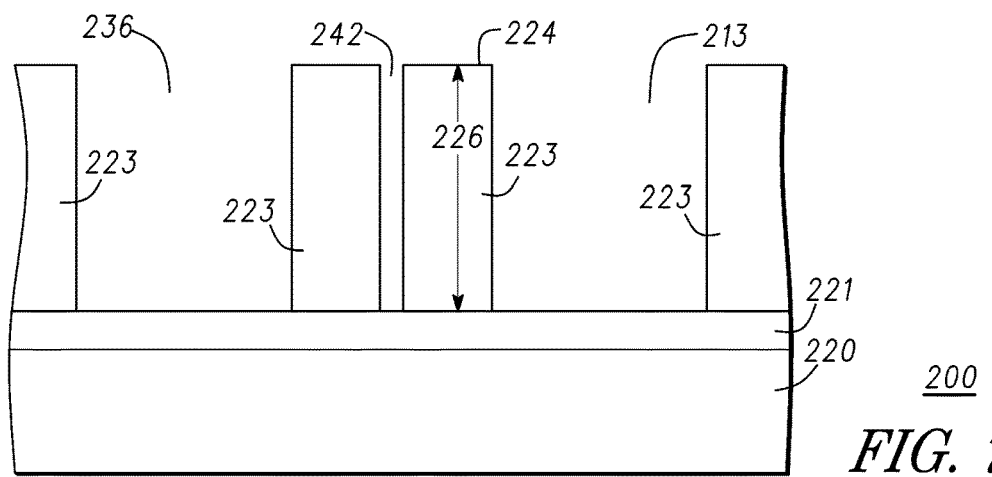

FIG. 7A illustrates an enlarged plan view of device 200 at a stage in an example of an embodiment of a method of forming device 200 and diode 201. FIG. 7B illustrates a cross-sectional portion of device 200 and diode 201 along section line 7B-7B of FIG. 7A. Device 200 and diode 201 may be formed on a semiconductor substrate 220. An optional insulating layer 221 may be formed on a surface of substrate 220. A first semiconductor region 223 may be formed overlying substrate 220. In an embodiment, region 223 may be formed as an epitaxial layer on a surface of substrate 220, or alternately on a surface of layer 221. Region 223 may have an embodiment that may be formed as a doped region of substrate 220, such as for example by doping a portion of substrate 220. Substrate 220, layer 221, and region 223 may have an embodiment that is substantially the same as respective substrate 32, layer 33, and region 35 (FIG. 1).

Openings 213 and 236 may be formed in region 223 to extend from a major surface 224 of region 223 a first distance or depth 226 into region 223. Openings 213 and 236 may be formed by removing portions of region 223 where respective anode structures 205 and 235 are to be formed. The set of openings 213 may be spaced apart from the set of openings 236 by a distance sufficient to form cathode structure 238 between the set of openings 213 and the set of openings 236. In some embodiments, openings 213 and 236 may be formed completely through region 223 and in other embodiments depth 226 may be formed to be just less than the thickness of region 223. For example, distance 226 may have various embodiments wherein distance 226 may be greater than approximately twenty (20) microns, or may be less than approximately three hundred (300) microns, or may be greater than 50% of the thickness of region 223 or may be formed to be less than 95% of the thickness of region 223 or some depth in between.

An opening 242 may be formed in region 223 to extend from surface 224 into region 223. Opening 242 may have an embodiment that may be disposed between the set of openings 213 and the set of openings 263, either equidistant therebetween or some other position between the sets of openings. Opening 242 may optionally be formed at the same time as openings 213 and 236.

Figure 8A:
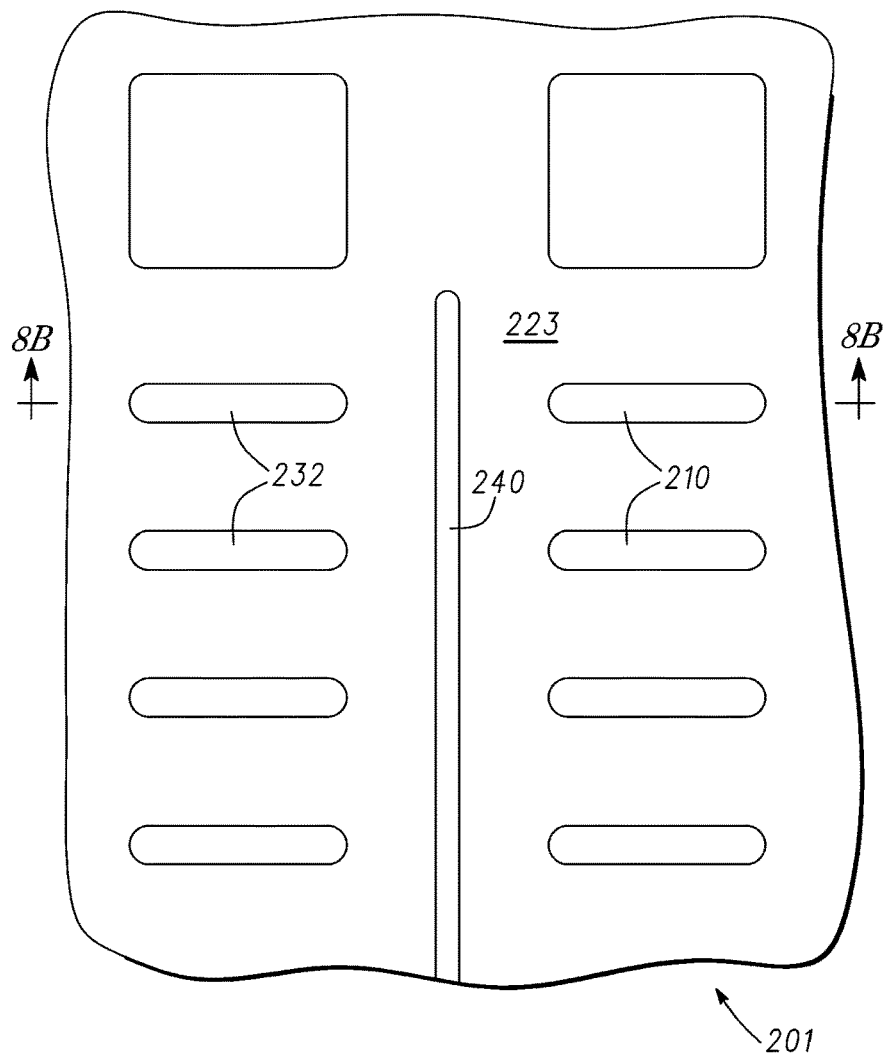
Figure 8B:
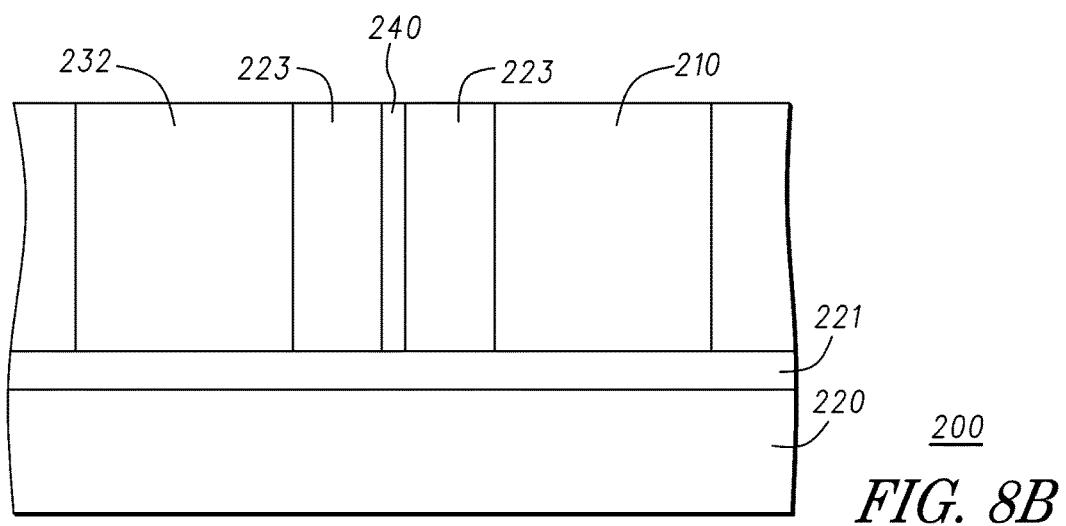

FIG. 8A illustrates a plan view of device 250 at a subsequent stage in an example of an embodiment of a method of forming device 250 and diode 251, and FIG. 8B illustrates a cross-sectional portion along section line 8B-8B of FIG. 8A. Openings 213 and 236 may be filled with a doped semiconductor material 210 and 232, respectively. In an embodiment, material 210 and 232 may be formed to have the opposite doping type as region 223.

Opening 242 may be filled with a doped semiconductor material 240. Material 240 may be formed to have the same doping type as region 223 but at a greater doping concentration. For example, material 240 may be N-type material with a doping concentration of approximately 1E17 to 1E19 atoms/cm$^3$. Region 223 may have an embodiment of N-type semiconductor material with a peak doping concentration of approximately 1E13 to 1E16 atoms/cm$^3$. In an embodiment, material 240 may be formed by depositing N-type polysilicon into opening 242 and materials 210 and 232 may be formed by depositing P-type polysilicon into respective openings 213 and 236.

Figure 9A:
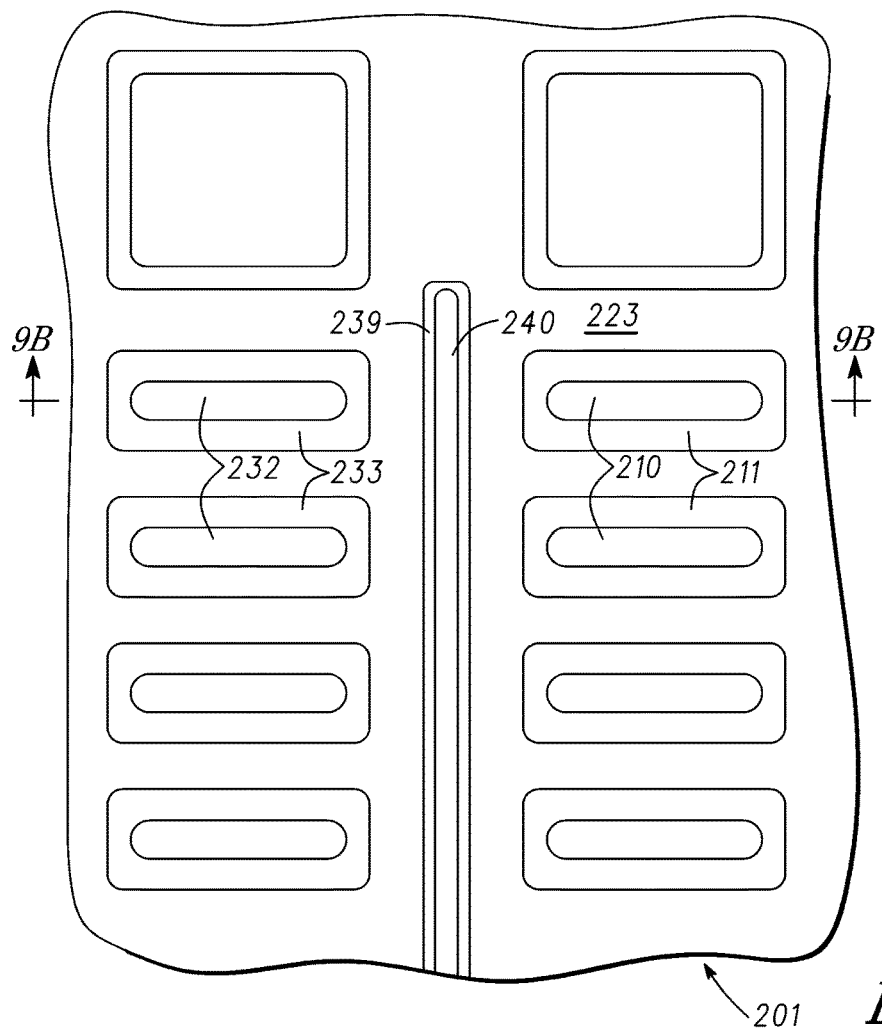
Figure 9B:
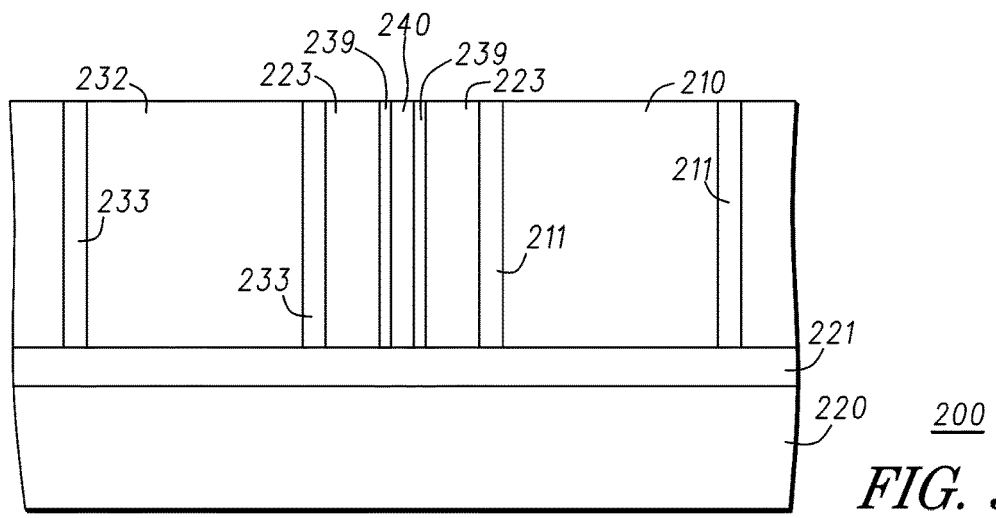

FIG. 9A illustrates a plan view of device 250 at a subsequent stage in an example of an embodiment of a method of forming device 250 and diode 251, and FIG. 9B illustrates a cross-sectional portion along section line 9B-9B of FIG. 9A. An optional heat treatment operation may be used to cause some of the dopants of materials 210 and 232 to diffuse into region 223 to form respective regions 211 and 233 surrounding materials 210 and 232. The operation may also cause some of the dopants from material 240 to diffuse into portions of region 223 to from region 239 surrounding material 240.

Figure 10A:
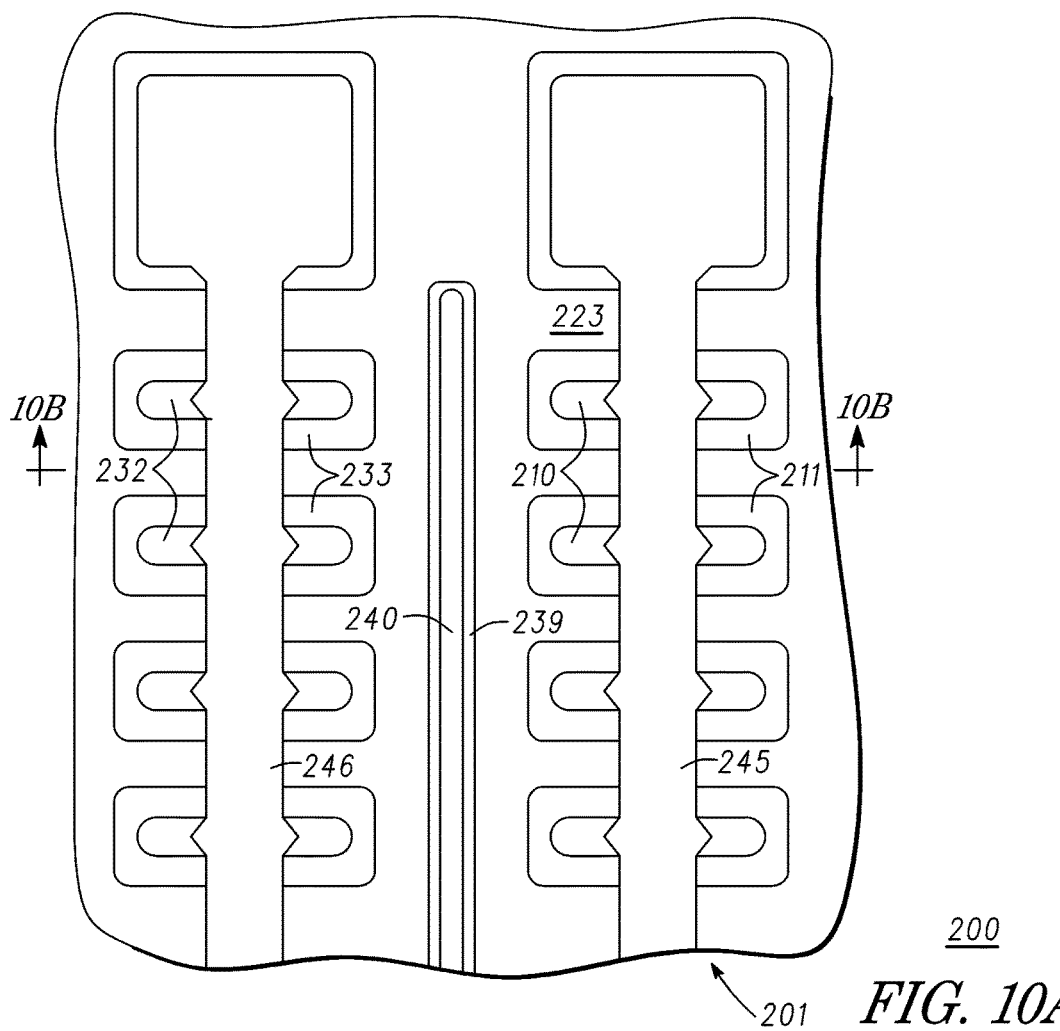
Figure 10B:
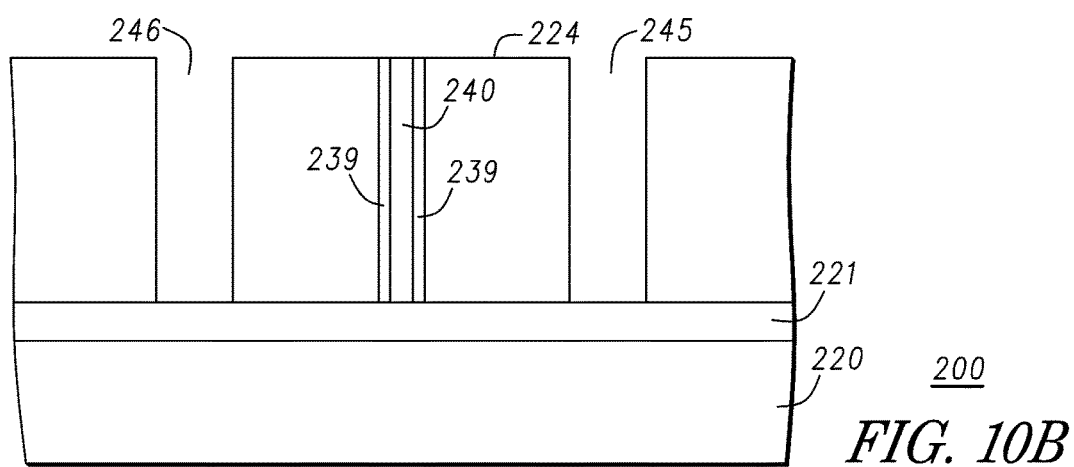

FIG. 10A illustrates a plan view of device 250 at a subsequent stage in an example of an embodiment of a method of forming device 250 and diode 251, and FIG. 10B illustrates a cross-sectional portion along section line 10B-10B of FIG. 10A. An opening 245 may be formed in region 223 where anode structure 205 is to be formed and an opening 246 may be formed in region 223 where anode structure 235 is to be formed. Openings 245 and 246 are formed to extend from major surface 224 a distance into region 223. In some embodiments, the distance may be substantially the same as distance 226. In other embodiments, the distance may be less than or greater than distance 226.

Referring back to FIGS. 6A and 6B, openings 245 and 246 may be filled with a Schottky material 237 that forms a Schottky barrier junction with the material of region 223 that is in contact with material 237. Material 237 may have an embodiment where material 237 may be formed at least on the sidewalls of openings 245 and 246 to form the Schottky barrier junction with the material of region 223. In an embodiment, region 223 is formed as an N-type semiconductor material with a doping concentration of no less than approximately 1E14 atoms/cm$^3$ and material 237 may be formed as a platinum silicide or other metal that forms a non-ohmic Schottky junction. The medium doping concentration of region 223 facilitates forming the Schottky barrier junction at substantially the interface of material 237 and the material of region 223.

Openings 245 and 246 along with material 237 may optionally be formed to extend into regions 210 and 211 to form an electrical connection thereto. Regions 210 and 211 are optional and may assist in improving the reverse breakdown voltage of diode 201.

Those skilled in the art will appreciate from the foregoing, that an embodiment of diode 201 may have a Schottky barrier junction that may extend substantially perpendicular to a major surface of diode 201 (such as for example surface 224) and form a current flow region along the depth of the Schottky junction. Thus, the current flow, illustrated in a general manner by arrows 203, from anode to cathode is substantially parallel to a major surface of region 223 and the substantially parallel current flow extends along a junction depth that is substantially perpendicular to the current flow and extends into the material of region 223. Forming the junction to extend perpendicular to surface 224 facilitates forming a large junction that can accommodate a large current flow and that does not occupy much area of surface 224 thereby reducing the cost of diode 201.

Figure 11:
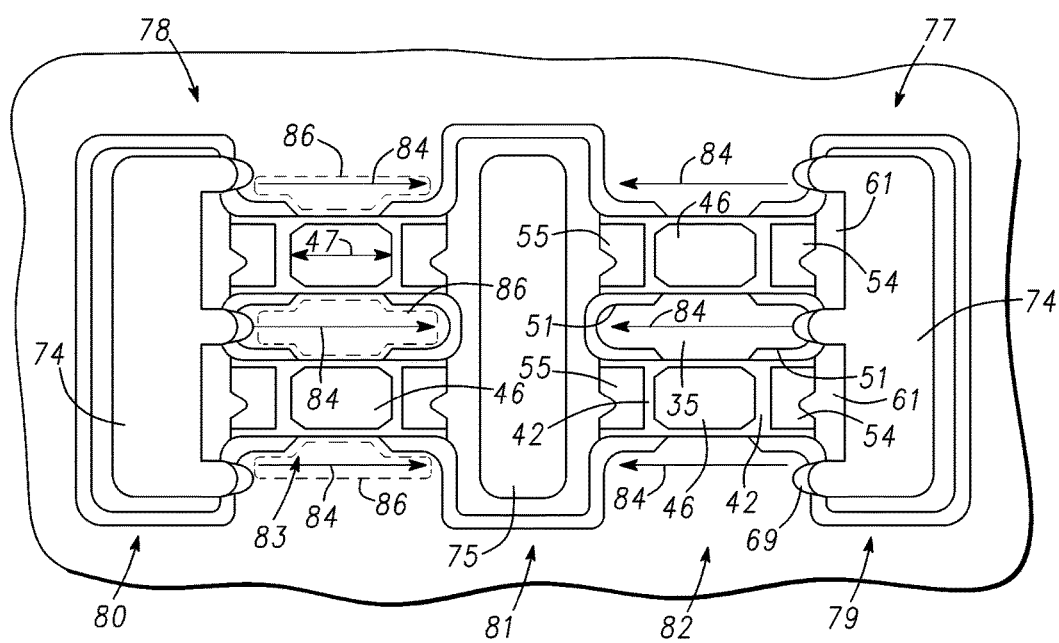
FIG. 11 illustrates an enlarged plan view of an example of an embodiment of a portion of a semiconductor device that includes one or more transistors in accordance with the present invention.

FIG. 11 illustrates an enlarged plan view of an example of an embodiment of a portion of a semiconductor device 30 that includes one or more transistors such as for example transistor 77 or 78. FIG. 11 illustrates an example embodiment 30 of transistors 77 and 78 formed as transistor cells that are interconnected to form a multi-celled transistor. However, those skilled in the art will appreciate that either or both of transistors 77 and 78 may be formed as an individual transistor. Additionally, an embodiment may include device 30 configured to include one or more transistor such as transistors 77 and/or 77 as a larger multi-celled transistor. An embodiment of transistor 77 may include a source structure 79, a drain structure 81, and a gate structure 82. Some embodiments, each transistor may include multiple gate structures 82 or 83. An embodiment of transistor 78 may include a source structure 80, drain structure 81, and a gate structure 83. In some embodiments, gate structures 82 and 83 may be substantially similar and source structures and 79 and 80 may be substantially similar. Drain structure 81 may, in an embodiment, be configured as a common drain for both of transistors 77 and 78. As will be seen further hereinafter, an embodiment of transistors 77 and 78 may be configured to form a channel region that has a width that extends substantially into the plane of the page of FIG. 11 and to have a channel length that extends laterally substantially along the plane of the page of FIG. 11 between drain structure 81 and respective source structures 79 and 80. A general illustration of one non-limiting example embodiment of a channel region is illustrated in a general manner by a dashed box 86. The channel region facilitates current flow through the channel region from the source region through the channel region to the drain region as illustrated in a general manner by arrows 84.

Figure 12A:
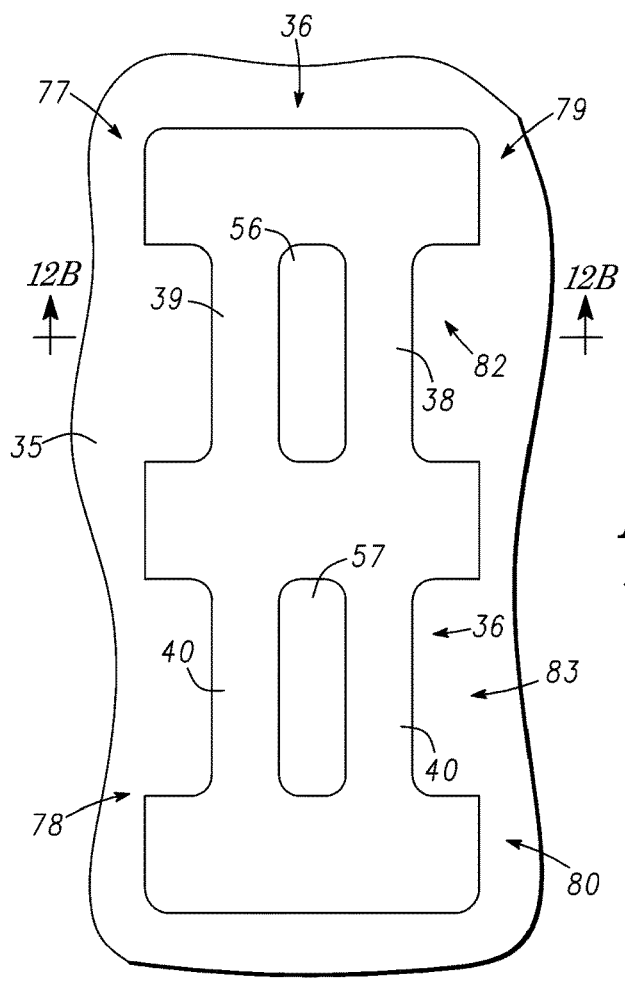
FIG. 12A illustrates a plan view of the semiconductor device of FIG. 11 at a stage in an example of an embodiment of a method of forming the semiconductor device in accordance with the present invention.
Figure 12B:
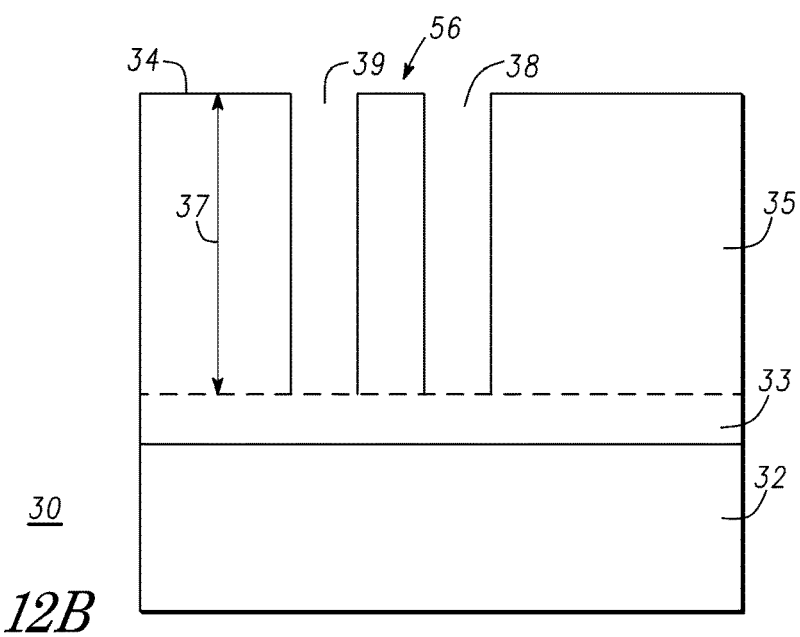
FIG. 12B illustrates a cross-sectional portion of the semiconductor device of FIG. 12A in accordance with the present invention.

FIG. 12A illustrates a plan view of device 30 at a stage in an example of an embodiment of a method of forming device 30. FIG. 12B illustrates a cross-sectional portion of device 30 along section line 12B-12B of FIG. 12A. This description has references to FIGS. 11, 12A, and 12B. In an embodiment, device 30 may be formed on a semiconductor substrate 32. For example, substrate 32 may be a silicon semiconductor substrate that was once a portion of a silicon wafer. Doped region 35 may be formed overlying substrate 32. In some embodiments, an optional insulator layer 33 may be formed between substrate 32 and doped region 35. Layer 33 may be formed as silicon dioxide or some other well-known insulator such as for example silicon nitride, etc. Doped region 35 may be formed as a doped epitaxial layer on or overlying substrate 32. In other embodiments, region 35 may be formed as a doped region within an epitaxial layer or may be formed as a doped region within substrate 32.

An opening 36 may be formed within doped region 35 and extending a distance or depth 37 into region 35. For example, opening 36 may extend from a first major surface or major surface 34 of region 35 distance 37 into region 35.

In some embodiments, opening 36 may be formed completely through region 35 and in other embodiments depth 37 may be formed to be just less than the thickness of region 35. For example, distance 37 may have various embodiments wherein distance 37 may be greater than approximately twenty (20) microns, or may be less than approximately three hundred (300) microns, or may be greater than 50% of the thickness of region 35 or may be formed to be less than 95% of the thickness of region 35 or some depth in between. Opening 36 may be formed by removing portions of region 35 where source structures 79 and 80, gate structures 82 and 83, and drain structure 81 are to be formed. Thus, opening 36 may be viewed as a plurality of openings that may include at least three openings, one or more openings for the portion where the gate structures are to be formed, one or more openings for the portion where the drain structure is to be formed, and one or more openings for the portion where the source is to be formed. The plurality of openings may be formed together in one operation or may be formed in two or more operations. Opening 36 includes openings 38 and 39 where portions of gate structures 82 are to be formed and openings 40 were portions of gate structures 83 are to be formed. Portions of region 35 are left adjacent to openings 38-40 where the channel regions of device 30 are to be formed. For example, in some embodiments pillars 56 and 57 of region 35 may remain between respective openings 38 and 39 and openings 40 to allow for device 30 to form a channel region through portions of pillars 56 and 57. A channel region may also be formed in portions of region 35 adjacent to other sides of openings 38-40 as illustrated by box 86 and arrows 84 in FIG. 11.

Figure 13A:
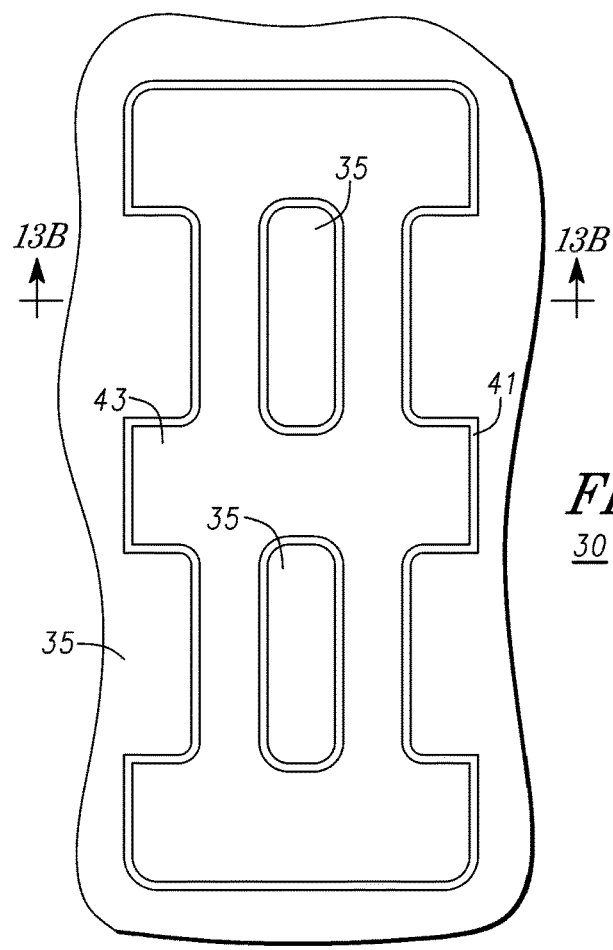
FIGS. 13A-18B illustrates various plan views and cross-sectional views of the semiconductor device of FIG. 11 at various stages in an example of an embodiment of a method of forming the semiconductor device of FIG. 11 in accordance with the present invention in accordance with the present invention.
Figure 13B:
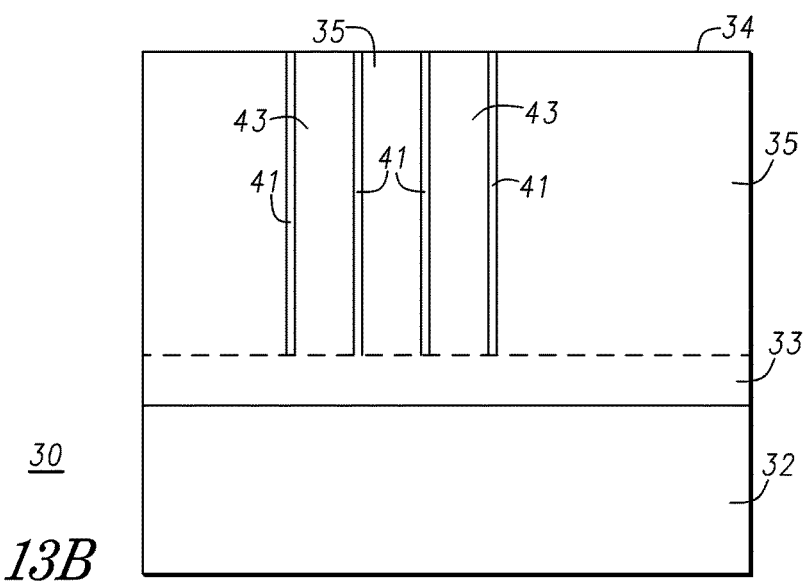

FIG. 13A illustrates a plan view of device 30 at a subsequent stage in an example of an embodiment of a method of forming device 30, and FIG. 13B illustrates a cross-sectional portion of device 30 along section line 13B-13B of FIG. 13A. An embodiment may include forming gate insulators 42 (FIG. 11) for a gate conductor 46 (FIG. 11) of gate structures 82-83. For example, an embodiment may include forming an insulator 41 along the sidewalls of opening 36. The remainder of opening 36 may be filled with a doped semiconductor material 43, for example N-doped semiconductor material. In an example embodiment, insulator 41 may be formed by oxidizing exposed portions of region 35 or may be formed by depositing various insulator material such as silicon nitride or other well-known insulator materials. Doped semiconductor material 43 may be formed as doped polysilicon or other doped semiconductor materials. An embodiment may include that material 43 is N-type doped polysilicon. Region 35 may have an embodiment wherein region 35 may be formed as P-type semiconductor material.

Figure 14A:
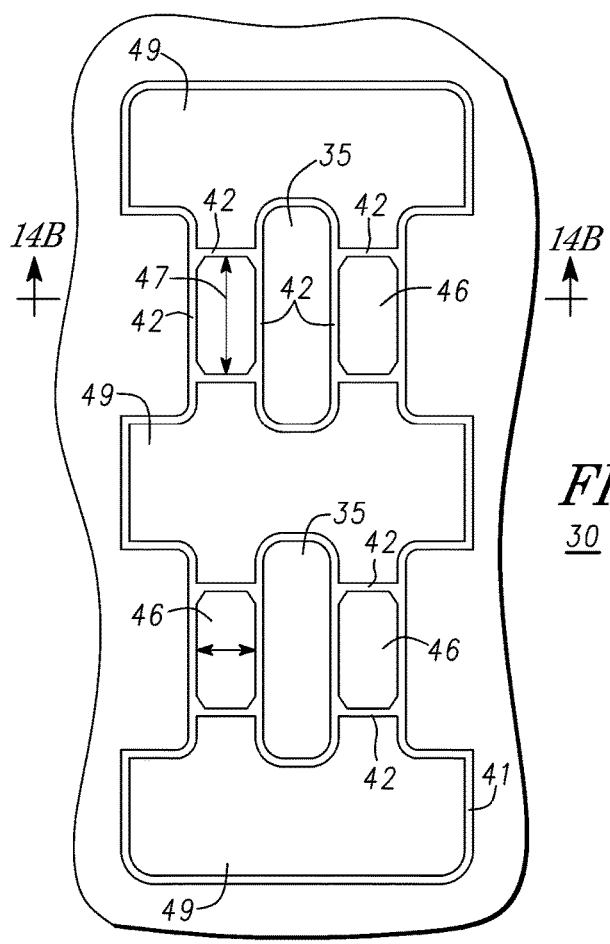
Figure 14B:
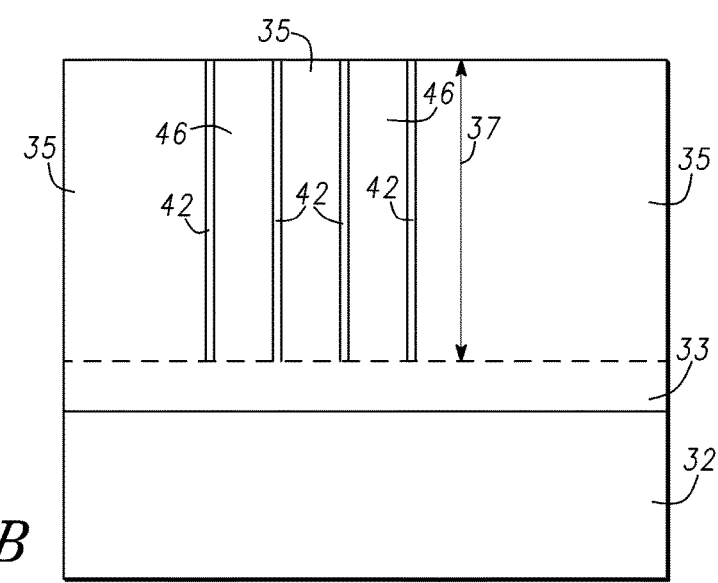

FIG. 14A illustrates a plan view of device 30 at a later stage in an example of an embodiment of a method of forming device 30, and FIG. 14B illustrates a cross-sectional portion of device 30 along section line 14B-14B of FIG. 14A. Portions of material 43 may be removed leaving a portion of material 43 in openings 38-40 as gate conductor 46. The removed portions of material 43 form openings 49 extending into region 35. Conductor 46 is formed to have a gate length 47 and a gate width that is substantially distance 37. One skilled in the art will appreciate that gate length 47 may be configured to form a channel in the portion of region 35 adjacent to conductor 46 that has a channel length that is similar to length 47 and a channel width that is similar to the width of conductor 46. Conductor 46 also has a thickness 52. Thickness 52 may extend perpendicular to the current flow, but those skilled in the art will understand that thickness 52 does not affect the length and/or width of the channel or the length or the width of the gate conductor (also often referred to as the gate length and/or gate width).

Subsequently, a gate insulator 42 may in an embodiment, be formed around conductors 46. In some embodiments, insulator 42 may be formed by oxidizing portions of conductor 46 and region 35. In other embodiments an insulating material may be deposited along conductor 46. In some embodiments, portions of insulator 41 that was along the sides of conductor 46 may remain as portions of insulator 42.

Figure 15A:
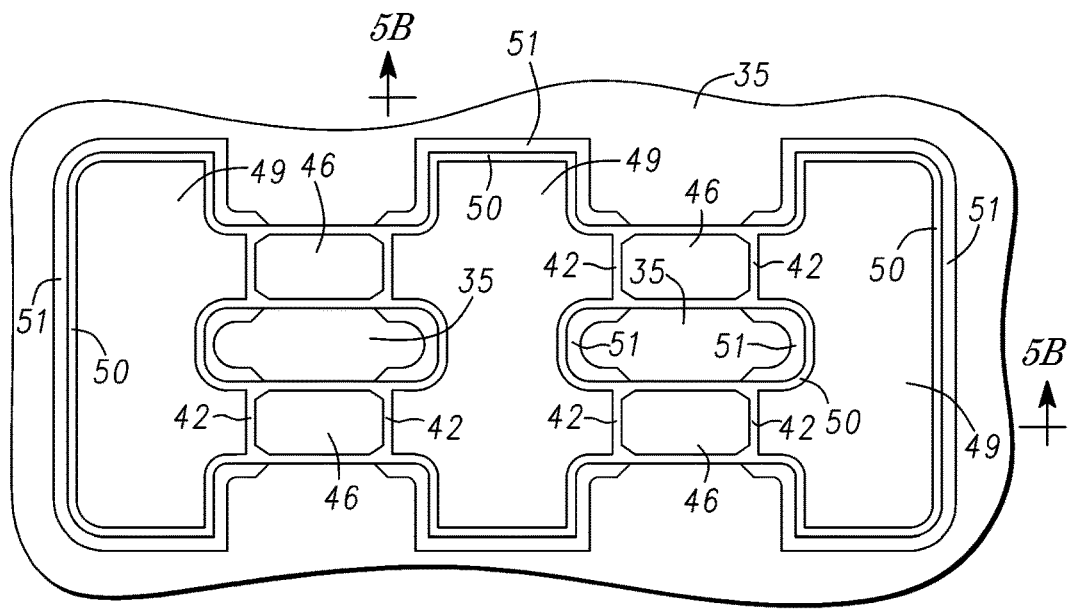
Figure 15B:
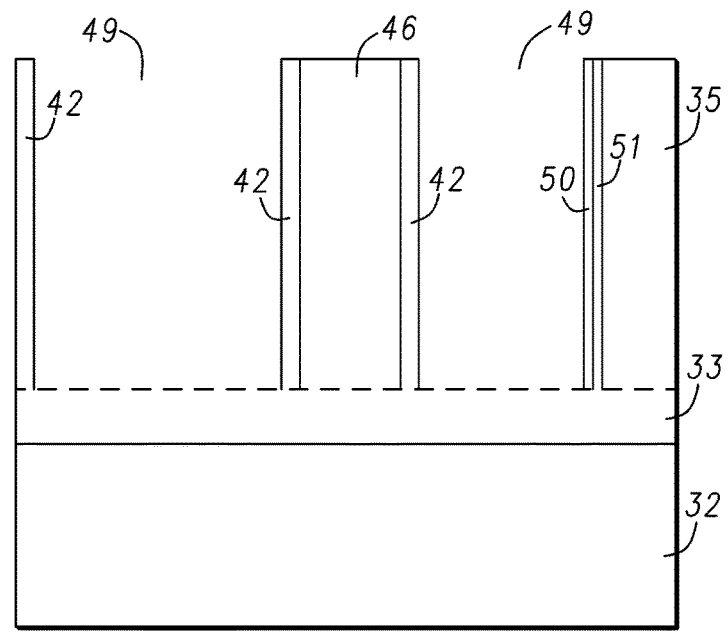

FIG. 15A illustrates a plan view of device 30 at a later stage in an example of an embodiment of a method of forming device 30, and FIG. 15B illustrates a cross-sectional portion of device 30 along section line 15B-15B of FIG. 15A. In some embodiments, a doped region 51 may be formed along the sidewalls of openings 49. An insulator 50 may be formed overlying the sidewalls of doped region 51. Some embodiments may include depositing doped semiconductor material, such as for example doped polysilicon, along the sidewalls, and in some embodiments along the bottom, of opening 49 and then oxidizing portions of the doped semiconductor material causing out diffusion of the dopants into surrounding portions of region 35 thereby forming doped region 51. Alternately, some embodiments may include depositing doped semiconductor material, such as for example doped polysilicon, along the sidewalls and bottom of opening 49, removing the doped material from the bottom of opening 49, and then oxidizing portions of the doped semiconductor material causing out diffusion of the dopants into surrounding portions of region 35 thereby forming doped region 51.

The oxidizing operation could also form insulator 50 on the sidewalls of region 51.

Portions of region 51 assist in functioning as the source of device 30.

Figure 16A:
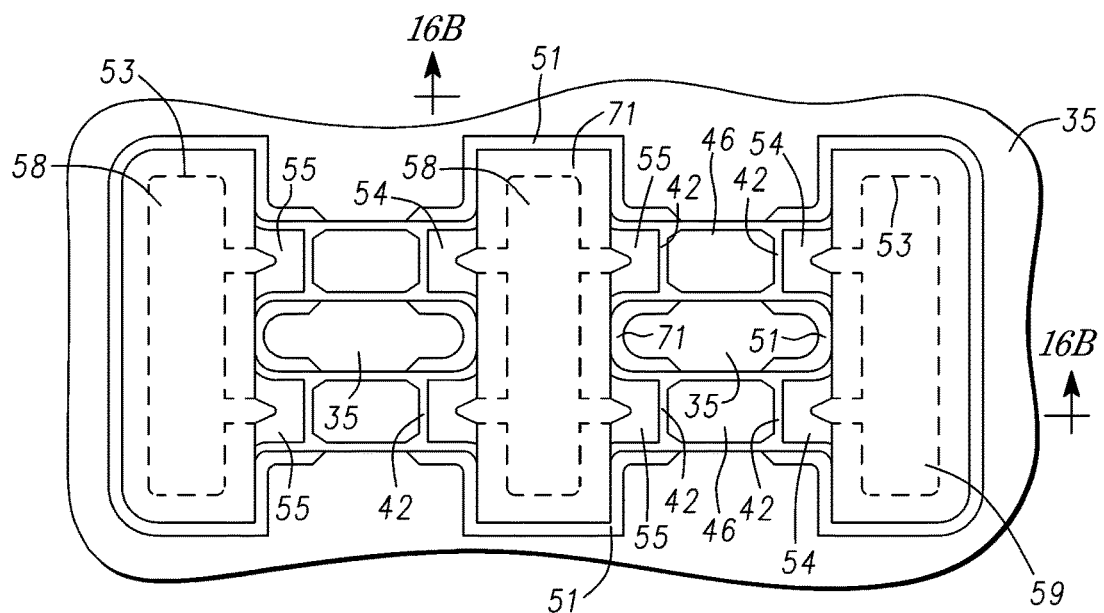
Figure 16B:
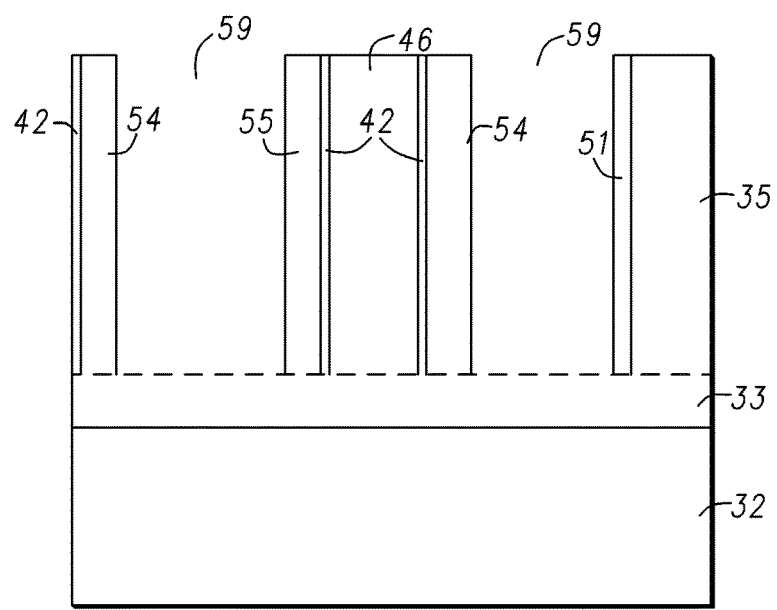

FIG. 16A illustrates a plan view of device 30 at a later stage in an example of an embodiment of a method of forming device 30, and FIG. 16B illustrates a cross-sectional portion of device 30 along section line 16B-16B of FIG. 16A. In some embodiments insulators 54 and 55 may be formed adjacent portions of insulator 42 and the ends of conductors 46. Insulator 50 may be removed in some embodiments. An embodiment may include forming insulators 54 and 55 by depositing an insulator 71 within openings 49, such as for example a Chemical Vapor deposition (CVD) of oxide or other insulating semiconductor material, as illustrated by dashed lines 53, and then removing portions of the deposited insulator leaving insulators 54 and 55. Removing the portions of insulator 71 may also remove insulator 50 or portions thereof. The remaining portions of openings 49 in source structures 79 and 80 are illustrated as openings 59 and the remaining portions of openings 49 in drain structure 81 is illustrated as opening 58.

Figure 17A:
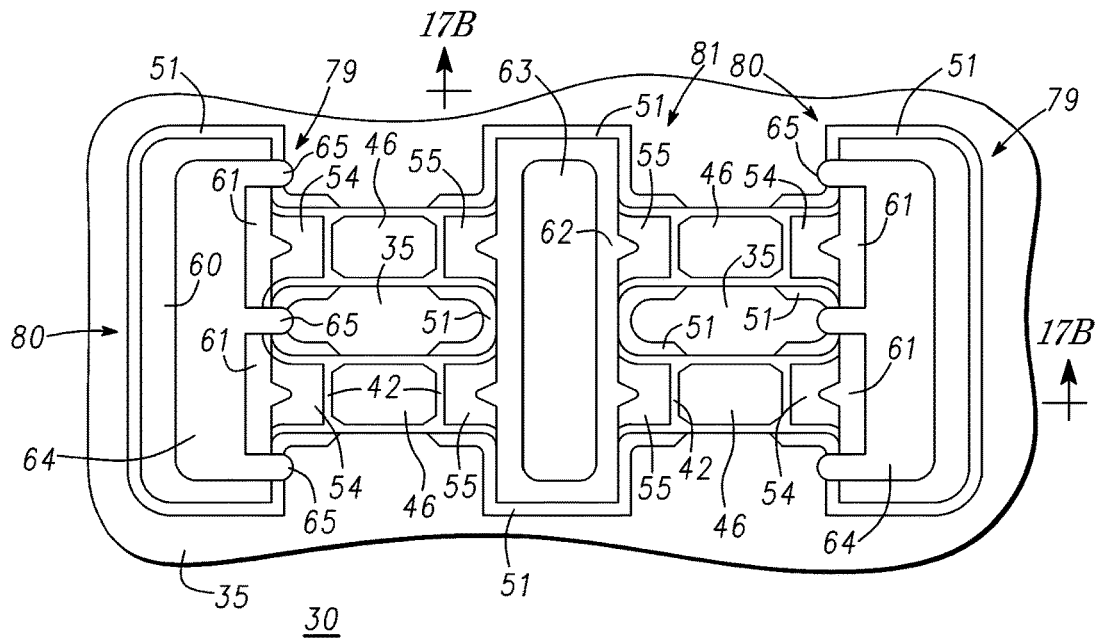
Figure 17B:
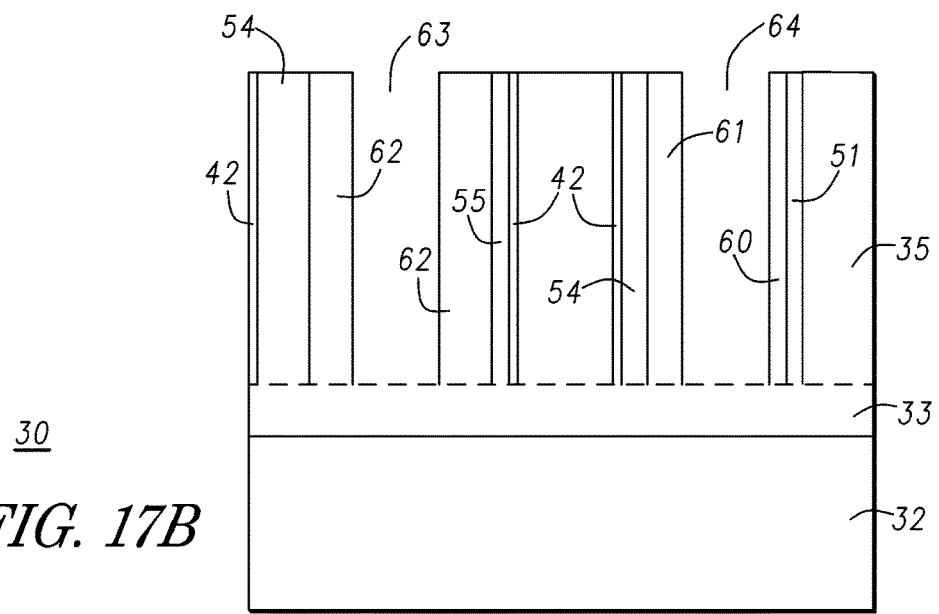

FIG. 17A illustrates a plan view of device 30 at a later stage in an example of an embodiment of a method of forming device 30, and FIG. 17B illustrates a cross-sectional portion of device 30 along section line 17B-17B of FIG. 17A. Additional doped regions 60 may be formed on the sidewalls of openings 59 and abutting region 51. Doped regions 61 may be formed abutting insulators 54 in source structures 79-80, and doped region 62 may be formed on the interior of opening 58 in drain structure 81. Forming regions 62 results in reducing opening 58 and forming regions 60-61 results in reducing opening 59 thereby creating respective openings 63 and 64. Protrusions 65 may also be formed extending from within openings 64 through doped regions 51 and 60 into or at least exposing adjacent portions of region 35. Doped regions 60 along with region 51 assist in forming a source region of structures 79 and 80, and doped regions 62 and 61 assist in forming the drain region of structure 81.

An example of an embodiment of a method of forming regions 60-62 may include depositing doped semiconductor material into opening 59 and then removing interior portions of the doped semiconductor material leaving regions 60 and 61 on the sides of opening 59 and leaving region 62 on the sides of opening 58 of structure 81. For example, openings 59 may be filled with doped polysilicon semiconductor material and portions of the doped polysilicon semiconductor material may be removed leaving doped regions 60-62. Removing the doped polysilicon semiconductor material may also be used to form protrusions 65 by removing portions of regions 51 and 60.

Figure 18A:
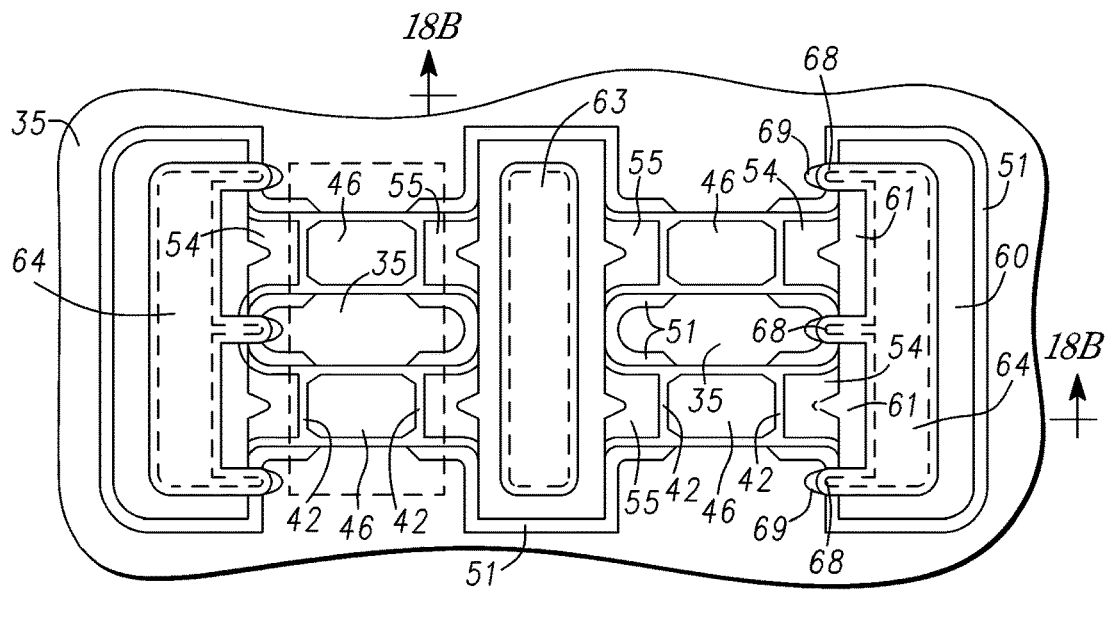
Figure 18B:
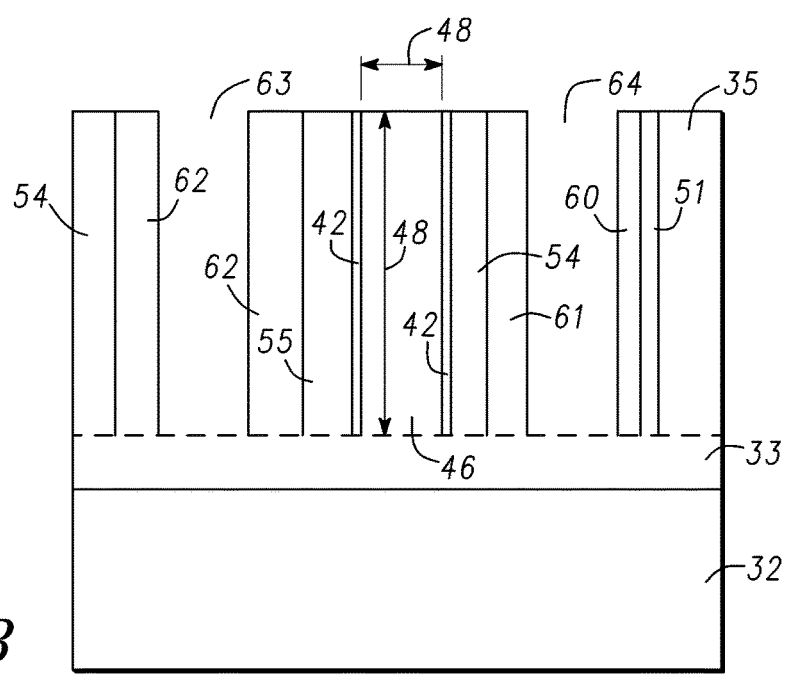

FIG. 18A illustrates a plan view of device 30 at a later stage in an example of an embodiment of a method of forming device 30, and FIG. 118B illustrates a cross-sectional portion of device 30 along section line 18B-18B of FIG. 18A. A doped region 68 may be formed along the sidewalls of protrusions 65, and an additional doped region 69 may be formed extending from doped region 68 into adjacent portions of or at least abutting adjacent portions region 35. In an example embodiment, a doped region may be formed along the sidewalls of opening 64, for example as illustrated by a dashed line 66. Thereafter, device 30 may be heat treated, such as for example subjected to an anneal procedure, to diffuse portions of the dopants from region 68 into region 35 and/or into regions 60, 61, and 62 thereby forming regions 69. Regions 69 assist in forming a low resistance electrical connection to the body region of transistors 77 and 78.

An embodiment may include that region 51 may be N-type semiconductor material. Region 51 may, in an embodiment, form a P-N junction with adjacent portions of region 35. The P-N junction may extend distance 37 into region 35. Region 62 may have an embodiment that may be N-type semiconductor material. An embodiment may include that region 62 forms a P-N junction with adjacent portions of region 35. This P-N junction may extend distance 37 into region 35. Region 51 may have an embodiment that may be doped heavily doped N-type silicon. An embodiment of region 35 may be lighter doped P type silicon. Region 69 may include an embodiment that may be heavily doped P-type silicon.

Referring back to FIG. 11, conductor material may be formed within openings 63 and 64 in order to provide source conductors 74 within openings 64 and drain conductor 75 within openings 63. In some embodiments, conductors 74 and 75 may extend out of the plane of the surface of region 35 in order to facilitate forming electrical connections to conductors 74-75. Although omitted from FIG. 11 for simplicity of the drawings, conductors 46 may be connected by an overlying not shown conductor layer, such as for example by a layer of a multi-layer metallization system, and may be connected thereby to a gate pad.

Those skilled in the art will appreciate from the foregoing, that an embodiment of device 30 may include gate conductor 46 which may be configured to have a gate length (such as for example length 47) that may be substantially parallel to a major surface of device 30 (such as for example surface 34). Structure 82 also may be formed with a gate width that extends a distance into the semiconductor material of device 30 (such as distance 37 into region 35) and also extends substantially perpendicular to the current flow.

Additionally, an embodiment of transistor 77 and/or 78 may be configured to form a channel region for current flow between a source region and a drain region wherein the current flow is substantially parallel to a major surface of region 35 and the substantially parallel current flow extends along a channel width that is substantially perpendicular to the current flow and extends into the into the material of region 35.

Those skilled in the art will appreciate that in an embodiment the gate of device 30 can be formed by forming an opening into region 35, forming an insulator on sidewalls of the opening and forming a doped semiconductor material within the opening and abutting the insulator. The source and drain of device 30 may also be formed, in an embodiment, by forming a corresponding source and drain opening that is wider than the gate opening and forming a doped semiconductor material within the opening, such that the doped semiconductor material in the drain opening is facing the doped semiconductor material in the source opening and the doped semiconductor material in the gate opening is between the source and drain openings.

From the foregoing, those skilled in the art will appreciate that an embodiment of a transistor may include a source region extending into a semiconductor material. A drain region extending into the semiconductor material with a portion of the semiconductor material disposed between and separating the source region from the drain region. The gate, including a gate conductor and a gate insulator, may extend into the semiconductor material and abut the portion of the semiconductor material. In an embodiment the source may be disposed adjacent to one side or adjacent to one corner of the gate and the drain may be disposed adjacent to the side or adjacent to a different corner of the gate. An embodiment may include the drain extending substantially parallel to the source into the semiconductor material. In some embodiments, the gate is not overlying the surface of the semiconductor material but is formed extending into the semiconductor material. In an embodiment, the source region, the drain region, and the gate may form a three sided shape that extends from the surface of the semiconductor material into the semiconductor material with the drain forming one side of the three sided shape, the source forming an opposite side of the three sided shape, the gate forming a connecting side of the three sided shape, and the semiconductor material extending into the opening of the three sided shape. An embodiment may include that the three sided shape is a U shape with the gate at the bottom of the U shape and semiconductor material extending into the opening of the U shape.

Figure 19:
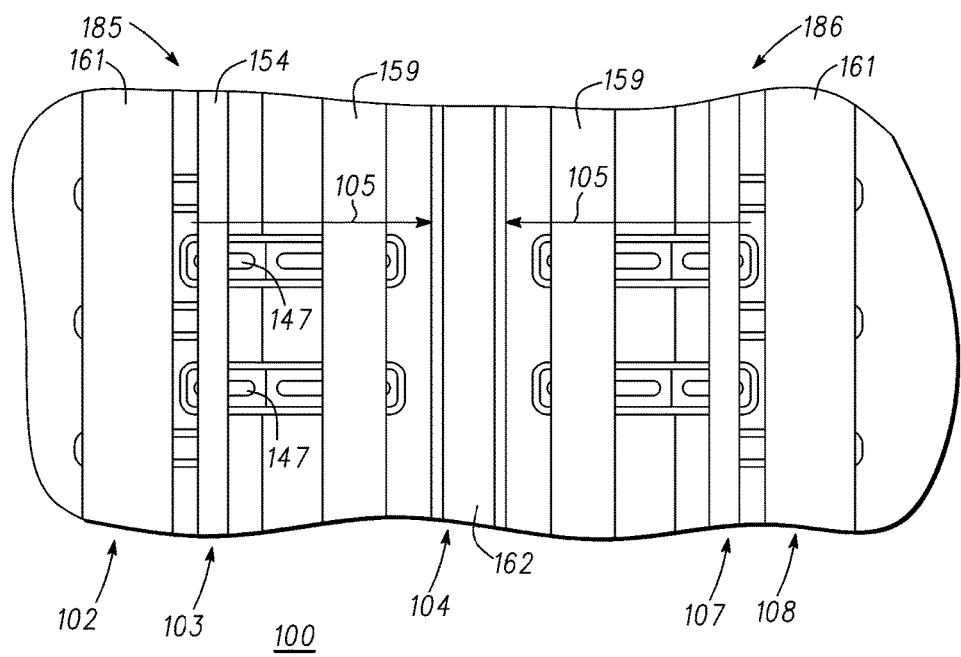
FIG. 19 illustrates an enlarged plan view of an example of an embodiment of a portion of a semiconductor device that may be an alternate embodiment of the semiconductor device of FIG. 11 in accordance with the present invention.

FIG. 19 illustrates an enlarged plan view of an example of an embodiment of a portion of a semiconductor device 100 that may be an alternate embodiment of device 30 described in FIGS. 11-18. In an embodiment, device 100 includes one or more transistors such as for example transistor 185 or 186. FIG. 19 illustrates an example embodiment of transistors 185 and 186 formed as transistor cells that are interconnected to form a multi-celled transistor. Additionally, an embodiment may include device 100 configured to include one or more transistor such as transistors 185 and/or 186 as a larger multi-celled transistor. However, those skilled in the art will appreciate that either or both of transistors 185 and 186 and/or device 100 may be formed as an individual transistor. An embodiment of transistor 185 may include a source structure 102, a drain structure 104, and a gate structure 103. An embodiment of transistor 186 may include a source structure 108, a gate structure 107, and drain structure 104. Drain structure 104 may, in an embodiment, be configured as a common drain for both of transistors 185 and 186. As will be seen further hereinafter, an embodiment of transistors 185 and 186 may be configured to form a channel region that has a width that extends substantially into the plane of the page of FIG. 19 and to have a channel length that extends laterally substantially along the plane of the page of FIG. 19 between respective source structures 102 and 108 and drain structure 104. An embodiment may include that device 100 is configured to form the channel width to extend substantially from the surface of device 100 a distance into device 100 that is substantially the same as source structure 102 extends into device 100. A general illustration of one non-limiting example embodiment of a channel region is illustrated in a general manner at the surface of device 100 by a dashed box 106. The channel region facilitates current flow through the channel region from the source region through the channel region to the drain region as illustrated in a general manner by arrows 105.

Figure 20A:
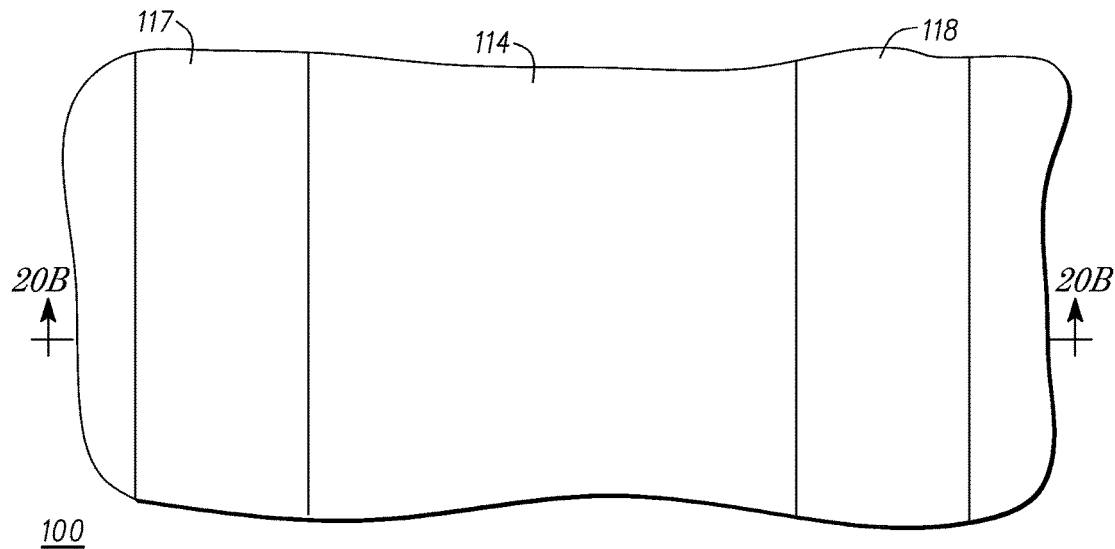
FIG. 20A illustrates a plan view of the semiconductor device of FIG. 19 at a stage in an example of an embodiment of a method of forming the semiconductor device in accordance with the present invention.
Figure 20B:
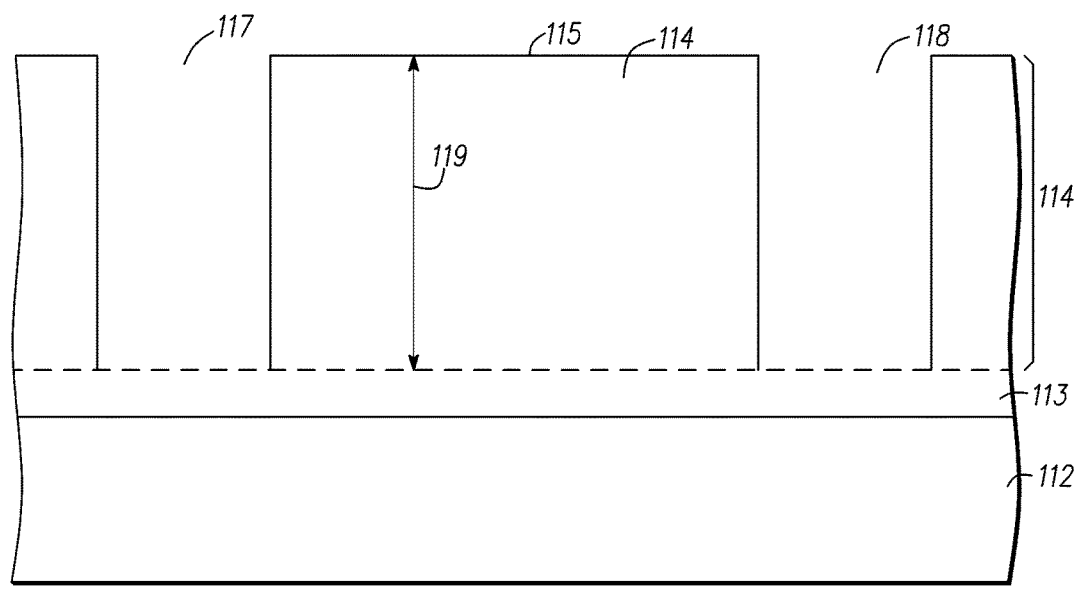
FIG. 20B illustrates a cross-sectional portion of the semiconductor device of FIG. 19A in accordance with the present invention.

FIG. 20A illustrates a plan view of device 100 at a stage in an example of an embodiment of a method of forming device 100. FIG. 20B illustrates a cross-sectional portion of device 100 along section line 20B-20B of FIG. 20A. This description has references to FIGS. 19, 20A, and 20B. In an embodiment, device 100 may be formed on a semiconductor substrate 112. In one example embodiment, substrate 112 may be substantially the same as substrate 32. A doped region 114 may be formed overlying substrate 112. In some embodiments, an optional insulator layer 113 may be formed between substrate 112 and doped region 114. In some embodiments, region 114 may be substantially the same as region 35. An embodiment may include that region 113 is substantially the same as region 33.

Openings 117 and 118 may, in an embodiment, be formed within doped region 114 and extending a distance or depth 119 into region 114. For example, openings 117 and 118 may extend from a first major surface or major surface 115 of region 114 distance 119 into region 114. In some embodiments, openings 117 and 118 may be formed completely through region 115 and in other embodiments depth 119 may be formed to be just less than the thickness of region 114. For example, distance 119 may have various embodiments wherein distance 119 may be greater than approximately twenty (20) microns, or may be less than approximately three hundred (300) microns, or may be greater than 50% of the thickness of region 114 or may be formed to be less than 95% of the thickness of region 114 or some depth in between. Openings 117 and 118 may be formed by removing portions of region 114 where source structures 102 and 108 are to be formed. In an embodiment, source structures 102 and 108 will be formed in respective openings 117 and 118. Openings 117 and 118 are spaced apart by a distance sufficient to form drain structure 104 and gate structures 103 and 107 between openings 117 and 118.

Figure 21A:
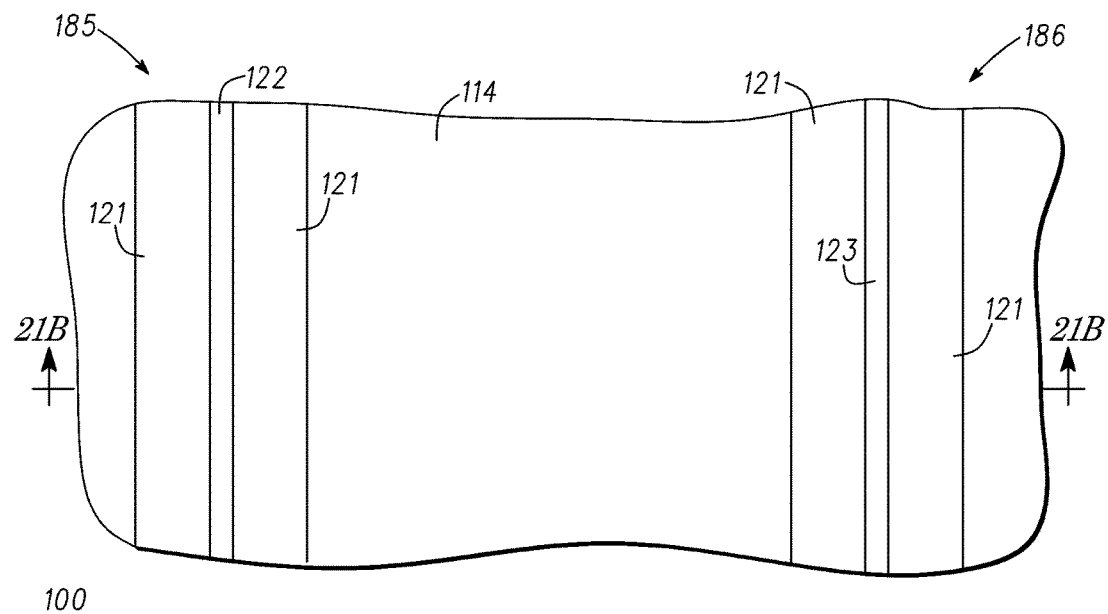
FIGS. 21A-27B illustrates various plan views and cross-sectional views of the semiconductor device of FIG. 19 at various stages in an example of an embodiment of a method of forming the semiconductor device of FIG. 19 in accordance with the present invention.
Figure 21B:
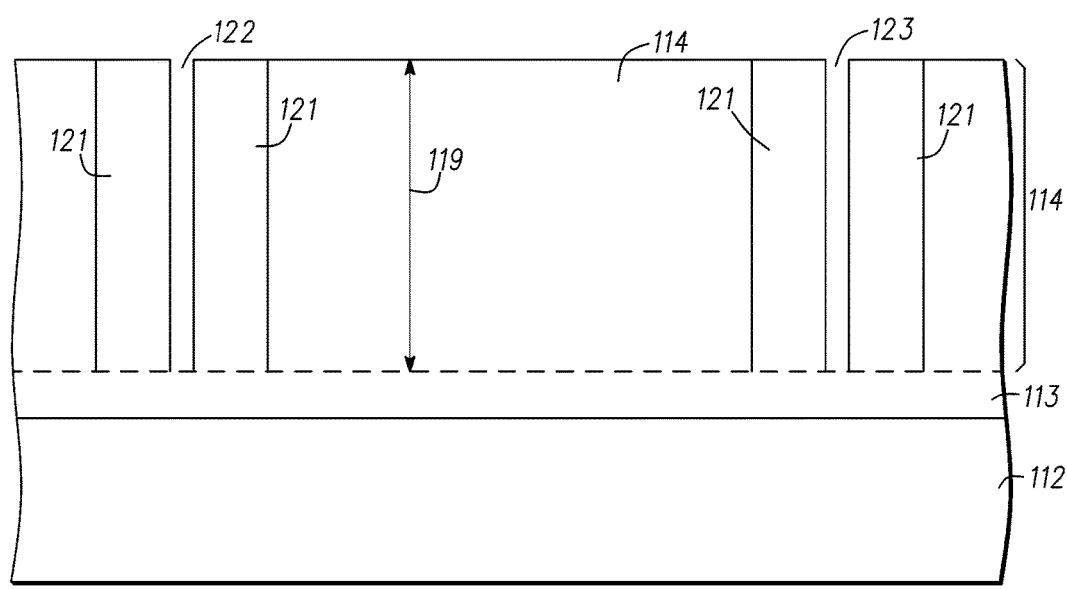

FIG. 21A illustrates a plan view of device 100 at a subsequent stage in an example of an embodiment of a method of forming device 100, and FIG. 21B illustrates a cross-sectional portion of device 100 along section line 21B-21B of FIG. 21A. An embodiment may include forming a doped semiconductor region 121 within openings 117 and 118. In an embodiment, region 121 may function as a body region of transistors 185 186. Region 121 may, in an embodiment, be formed as P-type semiconductor material with a doping concentration that is less than the doping concentration of region 114. Region 121 may be formed by depositing material within openings 117 and 118 or may be formed by epitaxial growth or by other known techniques. Portions of region 121 may have an embodiment that forms the body region of transistors 185 and 186.

An opening 122 may be formed within regions 121 and subsequently filled with a doped semiconductor material to form doped semiconductor regions 123. For simplicity of the drawings and explanation, opening 122 is illustrated in transistor 185 and region 123 is illustrated in transistor 186, however, openings 122 are formed in both transistors 185 and 186 and region 123 is subsequently formed in both transistors 185 and 186. Regions 121 and/or 123 may have an embodiment in which they extend substantially distance 119 into region 114. An embodiment may include that a portion of region 123 may form at least a portion of the source region of transistors 185 and 186. Region 123 may have an embodiment that is formed as an N-type region with a doping concentration that is greater than to the doping concentration of region 114, or an embodiment that is not greater than the doping concertation or region 114.

Figure 22A:
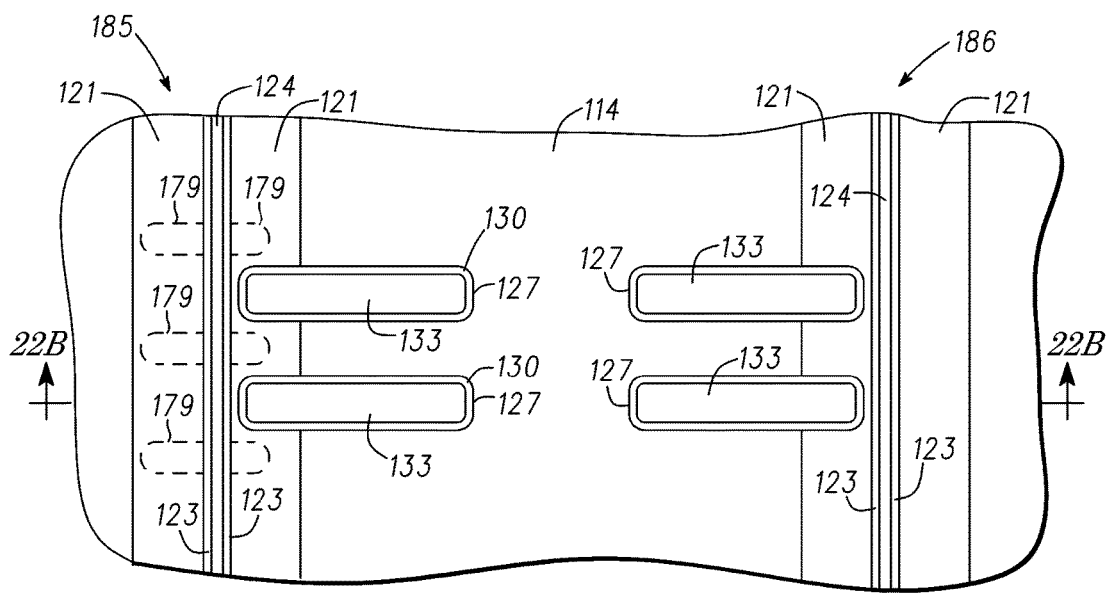
Figure 22B:
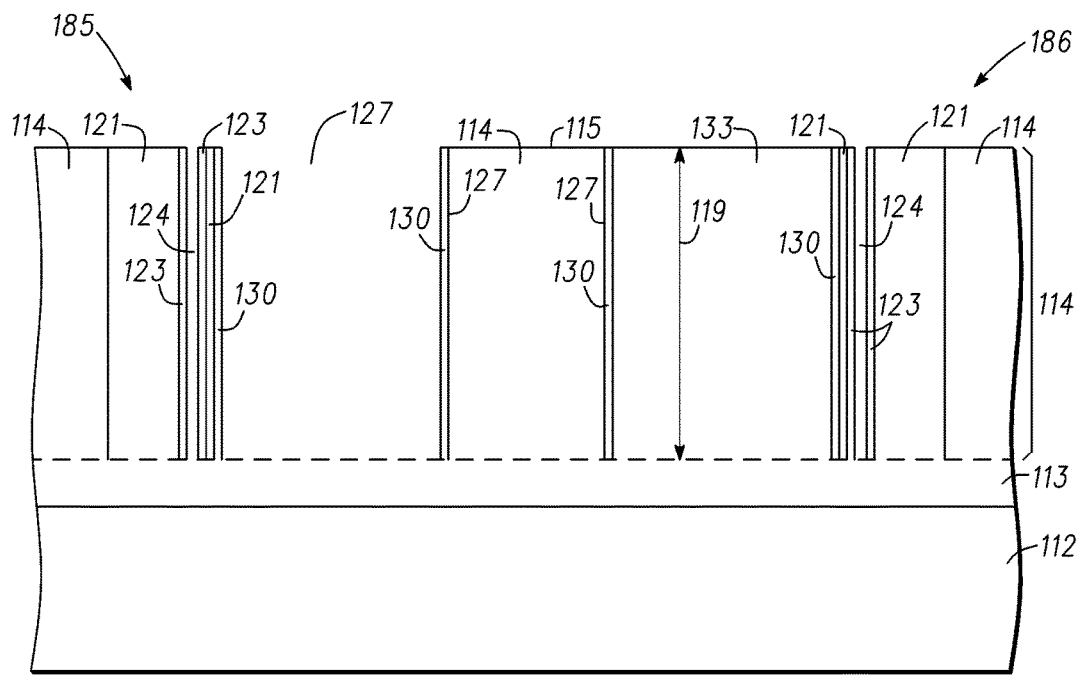

FIG. 22A illustrates a plan view of device 100 at another subsequent stage in an example of an embodiment of a method of forming device 100, and FIG. 22B illustrates a cross-sectional portion of device 100 along section line 22B-22B of FIG. 22A. Openings 127 may be formed in region 114 where gate structures 103 and 107 are to be formed. Openings 127 extend from surface 115 a distance into region 114. In an embodiment, openings 127 extend substantially the same distance into region 114 as region 123, such as, for example distance 119. Openings 127 extend laterally through region 121 and end near region 123. In some embodiments, openings 127 may extend laterally to abut region 123. Subsequently, an insulator 130 may be formed along the sidewalls of opening 127. Insulator 130 may assist in forming the gate insulator for transistors 185 and 186. For simplicity of the drawings, opening 127 along with insulator 130 are illustrated in the cross-sectional portion of transistor 185 to illustrate formation of opening 127, however, opening 127 is also formed in transistor 186 as illustrated by the lines marked 127 which illustrate the outer perimeter of opening 127. The remainder of opening 127 may be filled with a doped semiconductor material to form a doped region 133. Region 133 may have an embodiment that is formed as N-type doped semiconductor material. An embodiment may include that the doping concentrating of region 133 is greater than the doping concentration of region 114. Region 133 may also have an embodiment that is doped as P-type semiconductor material.

Figure 23A:
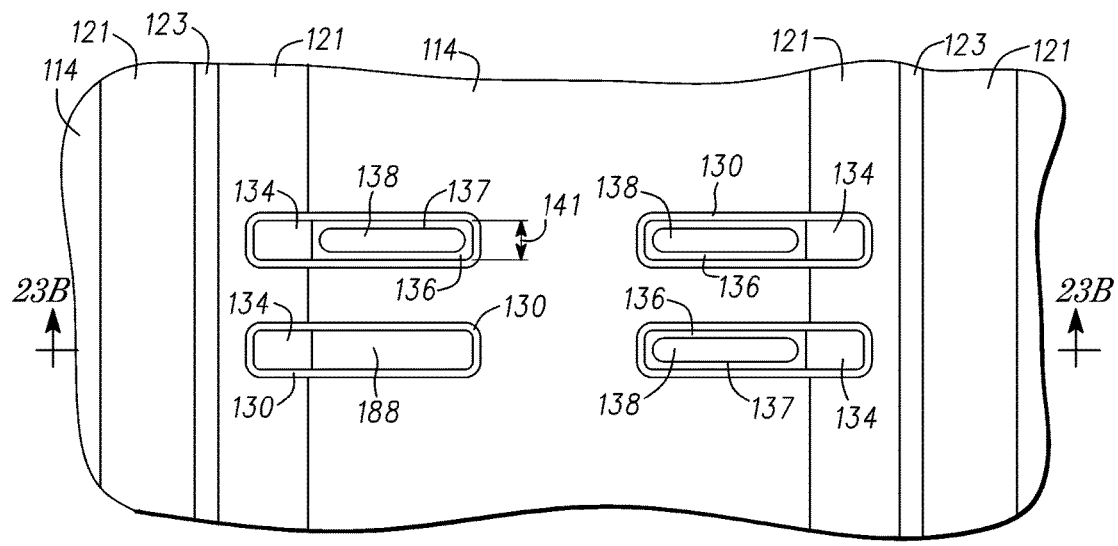
Figure 23B:
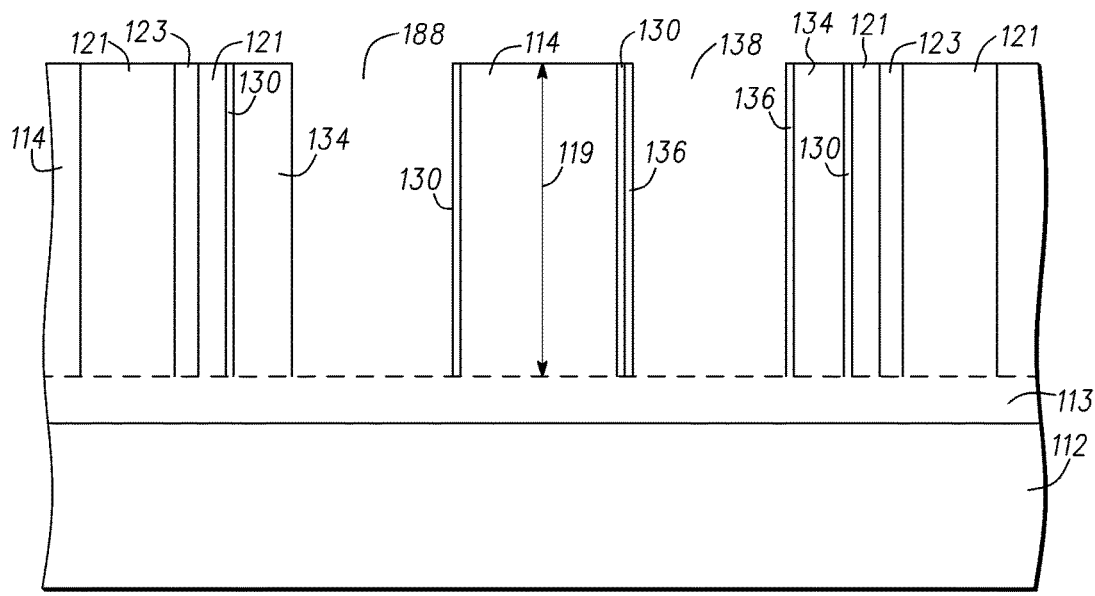

FIG. 23A illustrates a plan view of device 100 at another subsequent stage in an example of an embodiment of a method of forming device 100, and FIG. 23B illustrates a cross-sectional portion of device 100 along section line 23B-23B of FIG. 23A. FIGS. 23-27 include steps in a method that may also include forming an optional embodiment of device 100 that includes a gate structure having a shielded gate configuration. In some embodiments, such as for example embodiments that do not include a shielded gate type of gage structure, region 133 (FIG. 22) may function as the gate conductor of gate structures 103 and 107. Other portions of the steps illustrated in FIGS. 23-27 may also be used for a method of forming the non-shielded gate structure.

For the optional embodiment of transistors 185 and 186 that includes a shielded gate conductor, a portion of region 133 may be removed forming an opening 188 within region 133 and leaving a portion of region 133 as a gate conductor 134. For simplicity of the drawings and explanation, opening 188 is illustrated in one portion of gate structure 103 of transistor 185 but not in transistor 186, however, openings 188 may be formed in both transistors 185 and 186. An embodiment of gate conductor 134 may formed to be positioned to extend laterally, such as parallel to surface 115 for example, into region 121 toward region 123 in order to form the channel region(s) for device 100. Conductor 134 also extends vertically into region 114.

A shield insulator 136 may be formed in opening 188 to provide insulation between conductor 134 and the subsequently formed optional shield conductor. In one embodiment, insulator 136 may be formed by a low pressure chemical vapor deposition (LPCVD) operation. Insulator 136 may be silicon dioxide or other type of insulator material. An embodiment may include forming an opening 138 within an interior of insulator 136 in order to receive the shield conductor. An outside boundary of opening 138 is illustrated by a line 137. Opening 138 may be formed during the operation of forming insulator 136 such as for example by stopping the formation process prior to completely filling opening 188 with insulator 136. Alternately, opening 138 may be formed as a separate procedure to form an opening within insulator 136. For simplicity of the drawings and explanation, insulator 136 and opening 138 are illustrated in one portion of gate structure 103 of transistor 185 but not in transistor 186, however, insulator 136 and opening 138 are subsequently formed in both transistors 185 and 186.

Figure 24A:
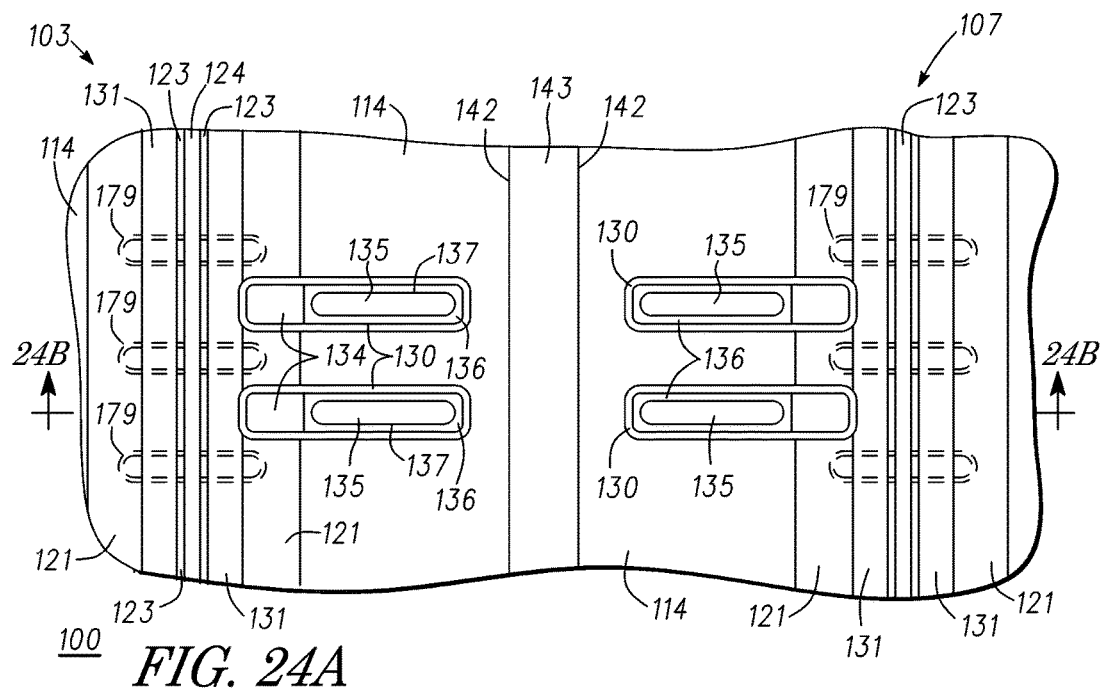
Figure 24B:
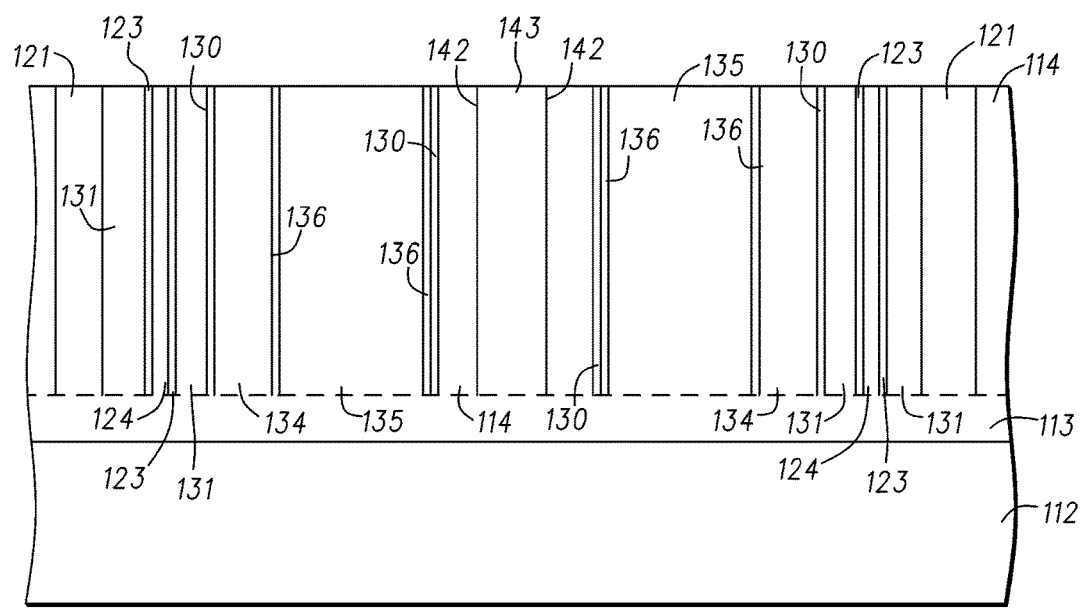

FIG. 24A illustrates a plan view of device 100 at another subsequent stage in an example of an embodiment of a method of forming device 100, and FIG. 24B illustrates a cross-sectional portion of device 100 along section line 42B-24B of FIG. 24A. A conductor material may be formed within opening 138 to form shield conductor 135. The conductor material may be formed as doped polysilicon material or other type of conductor material. An embodiment may include that the conductor material may be formed by depositing doped semiconductor material into opening 138.

In an embodiment, an operation may be performed to expand the size of region 123. For example, dopants from the doped material of region 123 may be diffused into the portion of region 114 adjacent to region 123 to increase the width of region 123 as illustrated by doped region 131 that has the same conductivity type as region 123.

Additionally, an opening 142 may be formed in region 114 where drain structure 104 is to be formed. Opening 142 is illustrated by the lines identified by the reference number pointing to the outer boundary of opening 142. Opening 142 may be position laterally between gate structures 103 and 107. A conductor material may be formed in opening 142 to form drain conductor 143. The conductor material may be formed as doped polysilicon material or other type of conductor material. An embodiment may include that the conductor material may be formed by depositing doped semiconductor material into opening 142. Opening 142 and conductor 143 extend from surface 115 into region 114. In an embodiment, opening 142 and conductor 143 may extend substantially distance 119 into region 114.

An embodiment may include forming a doped region 165 (FIG. 26A) in source structures 103 and 107. In some embodiments, an opening 124 may be formed in region 123. An embodiment of opening 124 may assist in forming a source electrode for making an electrical connection to the source regions transistors 185 and 186. An optional embodiment may include forming opening 124 to include protrusions 179 that extend through region 123 to at least expose a portion of region 121. Protrusions 179 are illustrated in a general manner by dashed lines. The opening of protrusions 179 may subsequently assist in forming body contacts for transistors 185 and 186. Opening 124 and/or protrusions 179 may be formed at the same time as opening 142 or may be formed as a different operation.

Figure 25A:
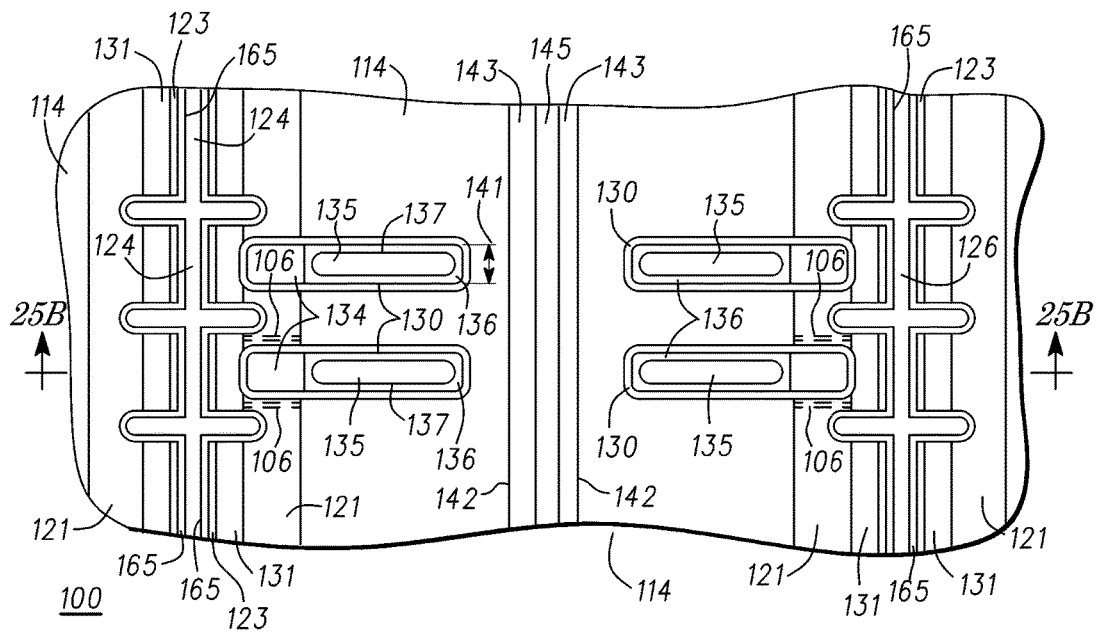
Figure 25B:
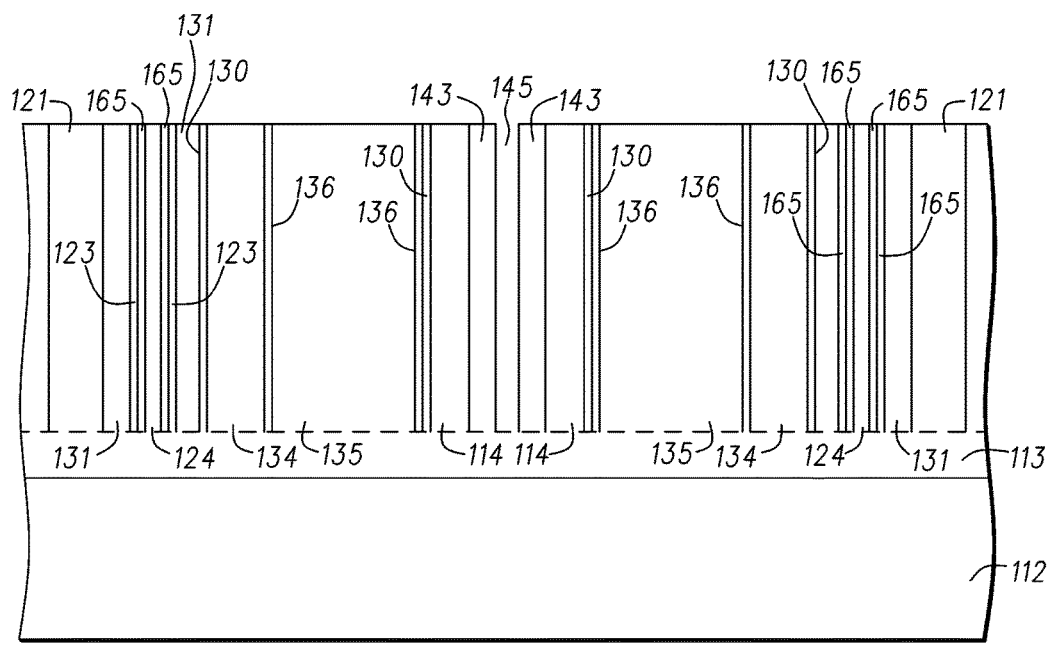

FIG. 25A illustrates a plan view of device 100 at another subsequent stage in an example of an embodiment of a method of forming device 100, and FIG. 25B illustrates a cross-sectional portion of device 100 along section line 25B-25B of FIG. 25A. An opening 145 may be formed in conductor 143 to assist in formed a low resistance contact to conductor 143. Opening 145 may have an embodiment that extends into conductor 143 substantially distance 119 in order to assist in forming the low resistance contact.

Figure 26A:
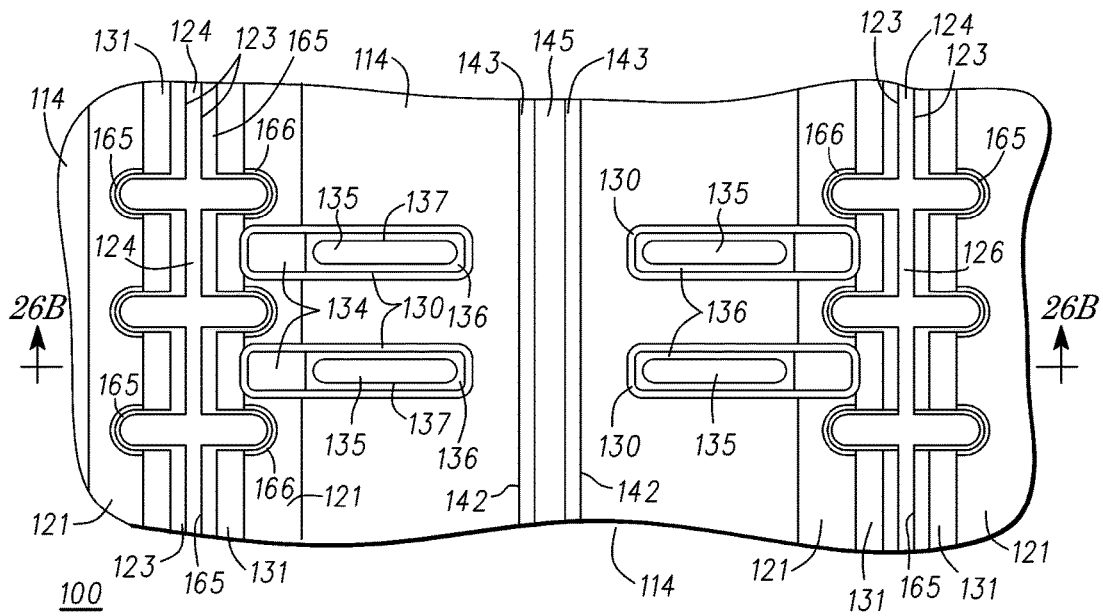

Additionally, a doped semiconductor material may be formed along the sidewalls of opening 124 and protrusions 179 to form doped regions 165 which will assist in forming regions 166 (FIG. 26A). In some embodiments, the doped semiconductor material that forms regions 166 may be deposited during the same operation as a shield conductor 135 in the embodiment that conductor 135 and regions 165 are the same conductivity type. In other embodiments, portions of regions 165 may be removed except at the end portions of protrusions 179 that extend into or abut region 121 leaving doped regions 166.

In an embodiment, insulator 130 may be disposed to extend laterally through region 121 with an end spaced a small distance from region 123 such that the portion of conductor 134 that is within region 121 and adjacent to region 123 can form a channel region in the portion of region 121 that is between region 123 and insulator 130 and to extend the channel region through region 121 as illustrated by dashed box 106. In one embodiment, the portion of region 133 remaining as gate conductor 134 may be configured to extend into region 121 and to be spaced apart from region 123 substantially by the thickness of insulator 130, thus, the channel region may be formed in region 121 as illustrated generally by the portion of box 106 along the sides of insulation 130.

Transistors 185 and 186 may have an embodiment wherein conductor 134 may be configured to form the channel region (illustrated generally by dashed box 106) that has a width that extends substantially into the plane of the page of FIG. 25A and to have a channel length that extends laterally substantially along the plane of the page of FIG. 25A between drain structure 104 (FIG. 19) and respective source structures 103 and 107 (FIG. 19). Those skilled in the art will appreciate that even though thickness 141 of conductor 134 may be perpendicular to the current flow, thickness 141 does not have an effect on the channel length and width. Those skilled in the art will appreciate that the plane of the width of conductor 134 is substantially perpendicular to the current flow and the plane of the thickness of conductor 134 is also perpendicular to the current flow but does not affect the channel width.

Figure 26B:
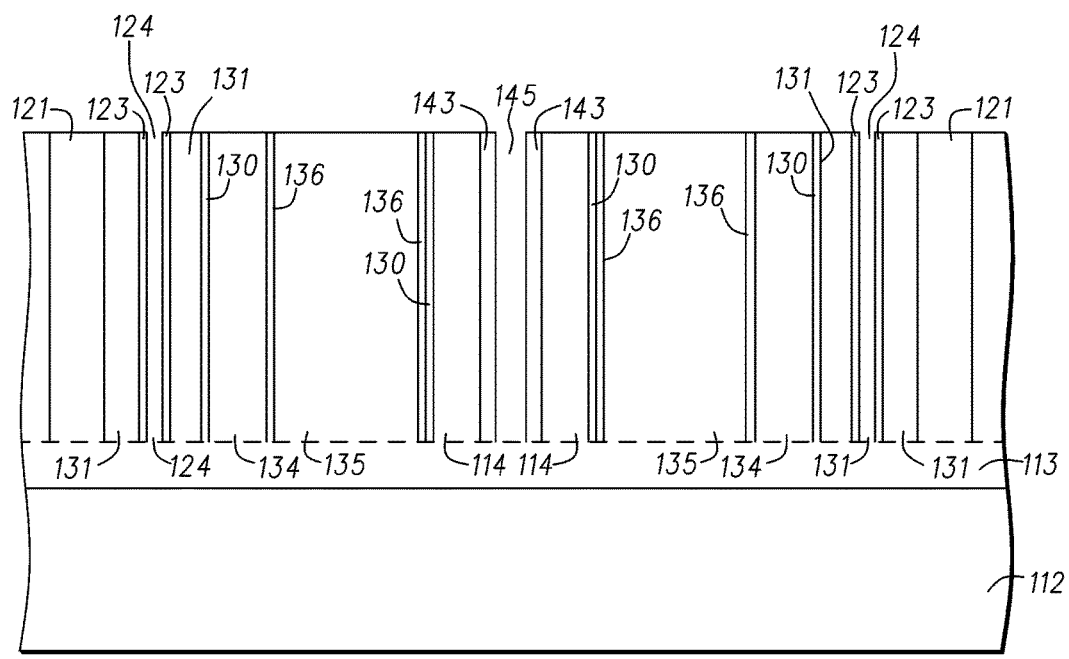

FIG. 26A illustrates a plan view of device 100 at another subsequent stage in an example of an embodiment of a method of forming device 100, and FIG. 26B illustrates a cross-sectional portion of device 100 along section line 26B-26B of FIG. 26A. An operation may be performed to cause dopants from the doped material of region 165 to diffuse into the portions of region 121 that are adjacent to regions 165 to form doped regions 166 in region 121. Regions 165 and/or 166 may assist in forming a body contact region for transistors 185 and 186. The dopants from the portions of material in protrusions 179 that are abut region 131 are counter doped by the material of region 131 leaving regions 165 in the portion of protrusions 179 that abut region 121. In some embodiments, a portion of the dopants from regions 165 of protrusions 179 that are adjacent to region 121 may expand into region 121 and form doped regions 166. In another embodiment, an angled implant may be used to form regions 166.

Figure 27A:
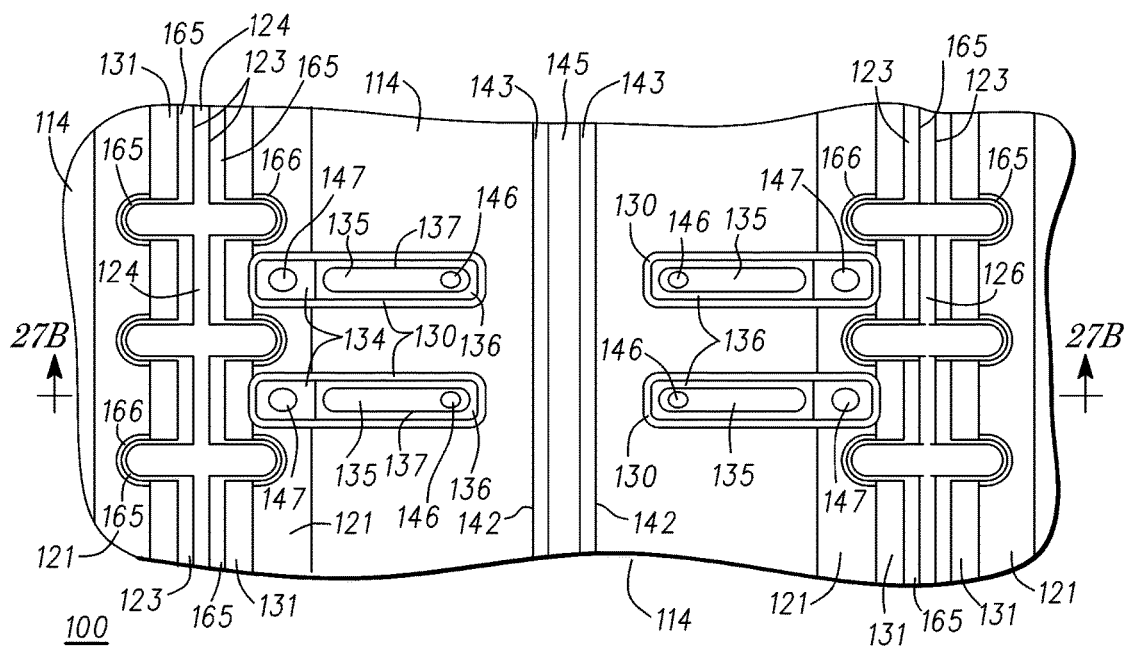
Figure 27B:
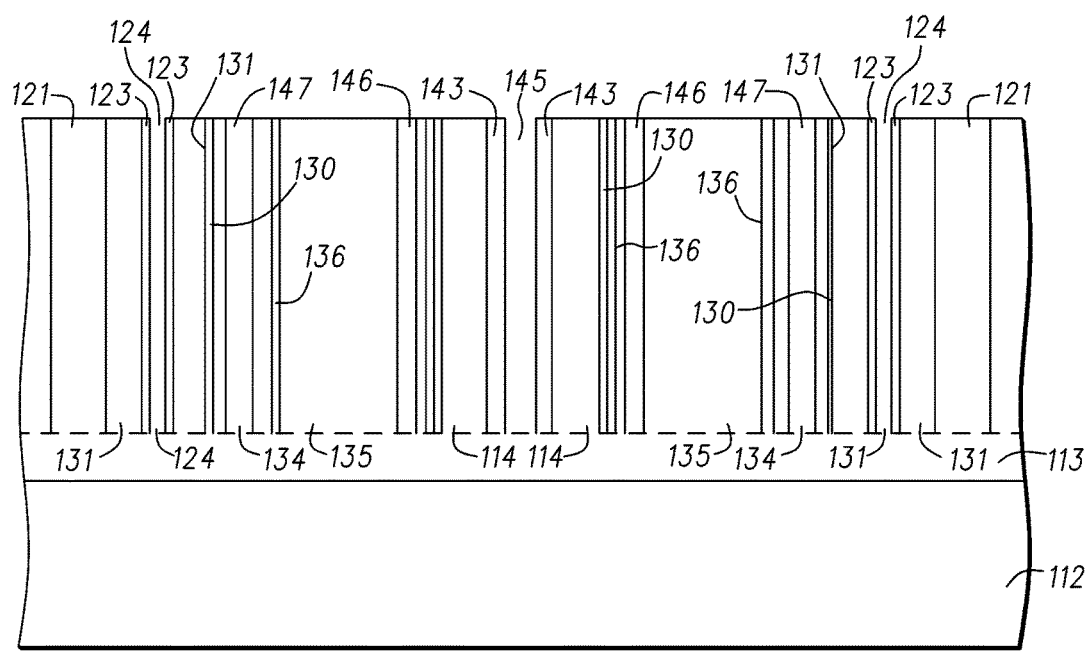

FIG. 27A illustrates a plan view of device 100 at another subsequent stage in an example of an embodiment of a method of forming device 100, and FIG. 27B illustrates a cross-sectional portion of device 100 along section line 27B-27B of FIG. 27A. Contact openings 147 may be formed in conductor 134 and contact openings 146 may be formed in shield conductor 135 in order to facilitate forming a low resistance electrical connection to the gate conductor and the shield conductor. Openings 146 and 147 may be formed to expose the surface of conductors 134 and 135 or alternately may be formed to extend into the material of regions respective conductors 134 and 135 to form a large area for making the electrical connection. An embodiment may include that openings 146 and 147 extend substantially distance 119 into respective conductors 134 and 138.

Referring back to FIG. 19, a source electrode material 161 may be formed within opening 124 to form a low resistance electrical connection to region 123 as the source of device 100 and to region 121 through the contact of regions 164-165 in the body region of device 100. An embodiment may also include forming a gate electrode material 154 within openings 147 to form a low resistance electrical connection to conductor 134 as the gate of device 100. An embodiment may include forming a shield electrode material 159 within openings 146 to form a low resistance electrical connection to shield conductor 135. Some embodiments may include forming a drain electrode material 162 within opening 145 in order to form a low resistance electrical connection to region 143 as a drain of device 100. In other embodiments, region 143 three may be connected to a drain electrode material on the bottom surface of substrate 112 in order to form the drain electrode for device 100. In some embodiments, materials 154, 159, 161, and 162 may be a metal conductor.

An embodiment may include that region 123 may be N-type semiconductor material. In an embodiment, region 123 may be a portion of the source region of device 100. An embodiment of region 131 may be formed as P-type semiconductor material. Region 131 may, in an embodiment, be a portion of a body region of device 100. Region 123 may, in an embodiment, form a P-N junction with adjacent portions of region 131. The P-N junction may extend distance 119 into region 114. Region 143 may have an embodiment that may be N-type semiconductor material. In an embodiment, region 143 may be a portion of the drain region of device 100. An embodiment may include that region 143 forms a P-N junction with adjacent portions of region 114. This P-N junction may extend distance 119 into region 35.

From all the foregoing, one skilled in the art will appreciate that an example of an embodiment of an MOS transistor may comprise a semiconductor substrate, such as for example substrate 32/and or substrate 12, a first doped region, such as for example region 35 and/or 114, overlying the semiconductor substrate, the first doped region having a major surface;

a second doped region, such as for example anyone of regions 51, 60, or 79, extending a first distance into the first doped region, a third doped region, such as for example anyone of regions 61, 62, or 87, extending substantially the first distance into the first doped region, the third doped region spaced apart from the second doped region;

a first portion of the first doped region, such as for example portion 86, positioned between the second and third doped regions, the first portion of the first doped region abutting the second doped region and the third doped region along the first distance; and a control electrode, such as for example anyone of electrodes 46 and/or 134, of the MOS transistor extending substantially from the major surface substantially the first distance into a second portion of the first doped region, the control electrode disposed adjacent to the first portion of the first doped region and between the second and third doped regions wherein the control electrode is configured to form a channel region for a current flow laterally from the second doped region through the first portion of the first doped region to the third doped region wherein the current flow in the channel region extends through the first portion of the first doped region and the channel region extends vertically the first distance through the first portion of the first doped region.

In an embodiment, the control electrode may have a gate length that extends laterally in a direction between the second and third doped regions and a width that may extend along the first distance into the first doped region.

Another embodiment may include that the control electrode may not be not overlying the major surface of the first doped region.

An embodiment may include that the first doped region, the second doped region, and the control electrode may form a three sided shape that extends into the first doped region with the second doped region forming one side of the three sided shape, the third doped region forming an opposite side of the three sided shape, the control electrode forming a connecting side of the three sided shape, and the first portion of the first doped region extending into an opening of the three sided shape wherein the opening includes a space enclosed by three sides of the three sided shape.

For example, the three sided shape may extend substantially perpendicular to the plane of the first major surface.

Another embodiment may include that the first doped region, the second doped region, and the control electrode may be formed in an opening that is formed in the first doped region.

Those skilled in the art will also appreciate that an example of an embodiment of a method of forming an MOS transistor may comprise, providing a first doped region, such as for example regions 35 and 114, having a first major surface and a second major surface that is positioned opposite to the first major surface;

forming an opening, such as for example opening 36 and/or 127 or 133, extending a distance into the first doped region, forming a second doped region extending into the opening, forming a third doped region extending into the opening and spaced apart from the second doped region; and forming a control electrode of the MOS transistor as a fourth doped region, such as for example region 46, extending into the opening and positioned between the second and third doped regions, the control electrode configured to form a channel region extending laterally between a source region and a drain region, the control electrode extending a first distance into the first doped region and abutting the channel region, the control electrode formed to have a gate length that extends substantially parallel to the first major surface and a gate width that extends substantially perpendicular to the first major surface and also extends into the first doped region adjacent to the channel region.

An embodiment of the method may include forming the channel region to abut the second and third doped regions.

Another embodiment of the method may include forming the second doped region as a source region extending into the first doped region, forming the third doped region as a drain region extending into the first doped region, and forming the channel region disposed between the second and third doped regions wherein the control electrode is configured to form a channel for current flow laterally from the second doped region toward the third doped region, the channel also extending along a depth of the control electrode.

In an embodiment, the method may include forming the control electrode to form the channel region to extend laterally and substantially continuously between the source region and the drain region.

An embodiment may include forming the control electrode to include a gate width that extends from the first major surface substantially the distance into the first doped region.

Those skilled in the art will also appreciate that an example of an embodiment of an MOS transistor may comprise, a first doped region, such as for example one of regions 35 and/or 14, having a first major surface and a second major surface that is positioned opposite to the first major surface, a second doped region, such as for example region 69 and/or region 31, extending a first distance into the first doped region between the first and second major surfaces, a third doped region, such as for example region 51 and/or 143, extending substantially the first distance into the first doped region, the third doped region spaced apart from the second doped region a first portion, such as for example a portion of region 86 and/or 114, of the first doped region positioned between the second and third doped regions, the first portion of the first doped region abutting the third doped region along the first distance; and a control electrode of an MOS transistor extending into the first doped region, the control electrode configured to form a channel having a channel width that extends substantially a first distance between the first and second major surfaces and a channel length that extends substantially parallel to the first major surface wherein the channel width is greater than the channel length.

Another embodiment may include a fourth doped region, such as for example region 121, that may be formed extending substantially the first distance into the first doped region, the fourth doped region abutting the second doped region and disposed between the second doped region and the first portion of the first doped region, wherein the channel extends laterally from substantially along an interface of the second and fourth doped regions into the fourth doped region and extends vertically substantially the first distance along the interface of the second and fourth doped regions.

An embodiment may include that the first portion of the first doped region may abut the second doped region and that the control electrode may be configured to form the channel to extend laterally though the first portion of the first doped region and to extend vertically substantially the first distance into first doped region.

In an embodiment, the control electrode may include a gate conductor having a length in a direction parallel to the first major surface, wherein the length is less than a depth of the control electrode into the first doped region.

An embodiment may include that current flow may extend laterally through the first portion of the first doped region and vertically the first distance through the first portion of the first doped region.

In an embodiment, a gate of the MOS transistor may form a channel region that extends the first distance into the first portion of first region and extends laterally a length of the gate between the second and third doped regions.

Those skilled in the art will appreciate that a method of forming an MOS transistor may comprise, providing doped semiconductor material having a first major surface and having a second major surface that is positioned on an opposite side from the first major surface, forming a first opening, such as for example opening 117, in the doped semiconductor material, forming a first doped region, such as for example region 123, in the first opening, forming a second opening, such as for example opening 142, in the doped semiconductor material, forming a second doped region, such as for example region 143, in the second opening wherein a portion of the doped semiconductor material is disposed between the first and second doped regions, forming a third opening, such as for example opening 127, in the doped semiconductor material wherein the third opening is positioned between the first opening and the second opening; and forming a third doped region, such as for example region 134, in the third opening wherein the third doped region forms a gate conductor of the MOS transistor including forming the third doped region adjacent to and spaced apart from the portion of the doped semiconductor material by an insulator, the third doped region configured to form a channel region in the portion of the doped semiconductor material wherein the channel region has a width that extends from substantially the first major surface of the doped semiconductor material a distance toward the second major surface of the doped semiconductor material.

An embodiment of the method may include forming the first doped region to extend a first distance into the first opening and forming the third doped region to extend substantially the first distance into the third opening.

An embodiment may include forming the third opening abutting the portion of the doped semiconductor material.

In an embodiment, the method may include forming the doped semiconductor material overlying a semiconductor substrate.

Another embodiment may include forming the first, second, and third doped regions to all have the same conductivity type.

An embodiment may include forming the doped semiconductor material with a first conductivity type, forming a fourth doped region of a second conductivity type in the first opening and forming the first doped region within the fourth doped region wherein the first, second, and third doped regions have the first conductivity type.

From all the foregoing, one skilled in the art will understand that an example of an embodiment of a semiconductor device may comprise:

a semiconductor substrate, such as for example substrate's 254 and/or 220, of a first conductivity type;

a semiconductor region, such as for example region 257 and/or 223, of the first conductivity type overlying the semiconductor substrate, the semiconductor region having a major surface;

a first opening, such as for example opening 265 and/or 213, formed to extend from the major surface of the semiconductor region a first distance into the semiconductor region;

a first material, such as for example material 265 and/or 257, within the first opening;

a semiconductor junction along a sidewall of the first opening, the semiconductor junction formed between the first material and the semiconductor region;

a second opening, such as for example 267 and/or 242, in the semiconductor region, the second opening extending substantially the first distance from the major surface into the semiconductor region; and a first semiconductor material, such as for example material 269 and/or 240, within the second opening, the first semiconductor material having the first conductivity type and a doping concentration that is greater than a doping concentration of the semiconductor region.

An embodiment may include that first material may be a second semiconductor material, such as for example material to 69, that has a second conductivity type that is opposite to the first conductivity type.

An embodiment may include a metal conductor on a surface of the first semiconductor material.

Another embodiment may include that first material may be a Schottky barrier material, such as for example material 240, that forms a Schottky barrier junction with the semiconductor region.

In an embodiment, an insulator may be between the semiconductor substrate and the semiconductor region.

Those skilled in the art will appreciate that method of forming a semiconductor device may comprise:

providing a semiconductor substrate, such as for example substrate 32 and/or 112;

forming a semiconductor region, such as for example region 58 and/or 138, of a first conductivity type on a surface of the semiconductor substrate, the semiconductor region having a major surface;

forming a first opening, such as for example opening 59 and/or 142, extending from the major surface a first distance into the semiconductor region;

forming a second opening, such as for example opening 58 and/or 118, extending from the major surface substantially the first distance into the semiconductor region;

forming a first semiconductor material, such as for example material 62 and/or 143, in the first opening, the first semiconductor material having a second conductivity type that is opposite to the conductivity type of the first conductivity type, the first semiconductor material forming a first P-N junction with the semiconductor region, the first semiconductor material forming one of a drain of a transistor or an anode of a diode; and forming a doped semiconductor region, such as for example region 51 and/or 123, in the second opening, the doped semiconductor region having the second conductivity type, the doped semiconductor region forming a second P-N junction with an adjacent semiconductor material, such as for example material 35 and/or 121, the doped semiconductor region forming one of a source of the transistor or a cathode of the diode.

An embodiment of the method may also include forming a third opening extending from the major surface substantially the first distance into the semiconductor region, and forming an insulator along at least a portion of sidewalls of the third opening, the insulator forming a fourth opening, and forming a second semiconductor material in the fourth opening wherein the insulator is between the second semiconductor material and sidewalls of the third opening.

Another embodiment may include forming the insulator between the second semiconductor material and the semiconductor region.

The method may also have an embodiment that includes forming a second semiconductor material, such as for example material 131, on sidewalls of the second opening and forming a third semiconductor material on sidewalls of the second semiconductor material.

An embodiment may include doping sidewalls of the second opening to have the first conductivity type, and forming a second semiconductor material, such as for example material 123, on the doped sidewalls.

Another embodiment may include forming a third opening, such as for example opening 127, extending from the major surface into the semiconductor region, forming an insulator on sidewalls of the third opening, and forming a doped semiconductor material on the insulator, the third opening positioned laterally across the major surface between the first and second openings.

An embodiment may include forming a third opening in the first semiconductor material wherein the third opening extends into the first semiconductor material near to the first distance, and filling the third opening with a metal conductor.

The method may have an embodiment including forming a fourth opening in the doped semiconductor region wherein the fourth opening extends into the first semiconductor material near to the first distance, and filling the fourth opening with another metal conductor.

Another embodiment may include forming a portion of a third semiconductor region, such as for example region 65 and/or 165 and/or 166, to extend laterally along a plane of the major surface through the doped semiconductor region and into the adjacent semiconductor material, the third semiconductor region extending from the major surface into the semiconductor region.

An embodiment may include forming a third opening extending from the major surface substantially the first distance into the semiconductor region, and forming a first insulator, such as for example insulator 130, along at least a portion of sidewalls of the third opening, the first insulator forming a fourth opening, such as for example opening 133, and forming a second semiconductor material, such as for example material 134, in a first portion of the fourth opening wherein the first insulator is between the second semiconductor material and sidewalls of the third opening, forming a third semiconductor material, such as for example material 135, in a second portion of the fourth opening, and forming a second insulator, such as for example insulator 136, separating the second and third semiconductor materials.

Those skilled in the art will also appreciate that a method of forming a semiconductor device may comprise:

forming a first semiconductor region of a first conductivity type overlying semiconductor substrate;

forming one or more openings extending from a major surface of the first semiconductor region a distance into the first semiconductor region;

forming a first current carrying electrode of the semiconductor device in a first portion of the one of more openings; and forming a second current carrying electrode of the semiconductor device in a second portion of the one of more openings wherein a first portion of the first semiconductor region is disposed between the first and second current carrying electrodes and separates the first and second current carrying electrodes from each other.

An embodiment of the method may include forming a first doped semiconductor region within the first portion of the one or more openings.

Another embodiment may include forming a second doped semiconductor region within the second portion of the one or more openings.

An embodiment may include depositing a first semiconductor material of a second conductivity type into the first portion of the one or more openings.

The method may have an embodiment that includes depositing a second semiconductor material of the second conductivity type into the second portion of the one or more openings.

In view of all of the above, it is evident that a novel device and method is disclosed. Included, among other features, is forming an active area of a semiconductor device to extend toward the semiconductor substrate into the semiconductor region in which the active regions are formed. Forming the active elements, such as for example a P-N junction or a channel region or a gate of an MOS transistor, of the devices to extend toward the substrate into the semiconductor regions reduces the surface area of the semiconductor material that is occupied by the device. Thus, more devices can be formed in a given area of semiconductor material thereby reducing the cost of the devices using the devices. Some embodiments may also include, among other features, forming a gate, such as for example a gate conductor, of an MOS transistor to have to have a length that extends laterally substantially parallel to a surface of the transistor and to have a width that extends vertically into the body region and/or into the drift region of the transistor. Thus, the channel region also has a width that extends vertically into the channel region even though the current flow is laterally substantially parallel to a major surface of the semiconductor material in which the drift region is formed. Forming the gate width, and the channel width to extend vertically to have a length that extends laterally reduces the surface area of the semiconductor material that is occupied by the transistor. Thus, more transistors can be formed in a given area of semiconductor material thereby reducing the cost of the devices using the MOS transistors. Those skilled in the art will appreciated that an embodiment of a semiconductor device may include forming an active region that extends vertically into the semiconductor material in which the semiconductor device is formed. The active region may include a P-N junction or alternately a gate or a channel region of an MOS transistor.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. Those skilled in the art will appreciate that the diode and transistor structures and methods therefor described herein are merely vehicles to explain method for forming semiconductor devices, and that the methods described herein may be used to form other types of semiconductor devices including, but not limited to, rectifiers, superjunction FETs, Zener diodes, varactors, signal diodes, Schokley diodes, PIN diodes, CCD's, etc. Additionally, although devices 30 and 100 are illustrated as lateral current flow devices that have a drain connection on the top surface of the device, those skilled in the art will appreciate that the drain connection alternately may go thought the bottom surface of substrates 32 and and/or 112. In an embodiment of device 30, opening 63 may be omitted and region 62 may extend into and through substrate 32. An embodiment of device 100 may include omitting opening 145 and extending region 143 into and through substrate 112.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a semiconductor device comprising:
    providing a semiconductor substrate;
    forming a semiconductor region of a first conductivity type on a surface of the semiconductor substrate, the semiconductor region having a major surface;
    forming a first opening extending from the major surface a first distance into the semiconductor region;
    forming a second opening extending from the major surface substantially the first distance into the semiconductor region;
    forming a first semiconductor material in the first opening, the first semiconductor material having a second conductivity type that is opposite to the conductivity type of the first conductivity type, the first semiconductor material forming a first P-N junction with the semiconductor region, the first semiconductor material forming a drain of a transistor;
    forming a doped semiconductor region in the second opening, the doped semiconductor region having the second conductivity type, the doped semiconductor region forming a second P-N junction with an adjacent semiconductor material, the doped semiconductor region forming a source of the transistor; and
    forming a third opening extending from the major surface substantially the first distance into the semiconductor region, and forming an insulator along at least a portion of sidewalls of the third opening, wherein a portion of the third opening remains as a fourth opening within the insulator, and forming a second semiconductor material in the fourth opening wherein the insulator is between the second semiconductor material and sidewalls of the third opening.

2. The method of claim 1 including forming the insulator between the second semiconductor material and the semiconductor region.

3. The method of claim 1 wherein forming the doped semiconductor region includes forming a second semiconductor material on sidewalls of the second opening and forming a third semiconductor material on sidewalls of the second semiconductor material.

4. The method of claim 1 wherein forming the doped semiconductor region includes doping sidewalls of the second opening to have the first conductivity type, and forming a second semiconductor material on the doped sidewalls.

5. The method of claim 1 wherein the third opening is positioned laterally across the major surface between the first and second openings.

6. The method of claim 1 including forming a portion of a third semiconductor region to extend laterally along a plane of the major surface through the doped semiconductor region and into the adjacent semiconductor material, the third semiconductor region extending from the major surface into the semiconductor region.

7. The method of claim 1 further including forming a third opening extending from the major surface substantially the first distance into the semiconductor region, and forming a first insulator along at least a portion of sidewalls of the third opening, the first insulator forming a fourth opening, and forming a second semiconductor material in a first portion of the fourth opening wherein the first insulator is between the second semiconductor material and sidewalls of the third opening, forming a third semiconductor material in a second portion of the fourth opening, and forming a second insulator separating the second and third semiconductor materials.

8. The method of claim 7 wherein forming the third semiconductor material includes forming a fifth opening in the second semiconductor material, forming the second insulator within a portion of the fifth opening thereby forming a sixth opening in the second insulator, and forming the third semiconductor material in the sixth opening.

* * * * *